US012660481B2

(12) United States Patent
Uchida

(10) Patent No.: US 12,660,481 B2
(45) Date of Patent: Jun. 16, 2026

(54) LIGHT EMITTING DEVICE, METHOD FOR MANUFACTURING LIGHT EMITTING DEVICE, AND ELECTRONIC DEVICE

(71) Applicant: SONY GROUP CORPORATION, Tokyo (JP)

(72) Inventor: Yoshinori Uchida, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 761 days.

(21) Appl. No.: 17/904,040

(22) PCT Filed: Jan. 21, 2021

(86) PCT No.: PCT/JP2021/001973
§ 371 (c)(1),
(2) Date: Aug. 11, 2022

(87) PCT Pub. No.: WO2021/166537
PCT Pub. Date: Aug. 26, 2021

(65) Prior Publication Data
US 2023/0063966 A1 Mar. 2, 2023

(30) Foreign Application Priority Data
Feb. 21, 2020 (JP) ................................. 2020-028194

(51) Int. Cl.
*H10K 59/80* (2023.01)
*H10H 20/852* (2025.01)
*H10H 20/855* (2025.01)

(52) U.S. Cl.
CPC ......... *H10K 59/879* (2023.02); *H10H 20/852* (2025.01); *H10H 20/855* (2025.01)

(58) Field of Classification Search
CPC ........... H10K 59/879; H10K 50/00–88; H10K 59/00–95; H10H 20/852; H10H 20/0363;
(Continued)

(56) References Cited

U.S. PATENT DOCUMENTS

2018/0145113 A1* 5/2018 Sakairi ..................... G09F 9/30
2021/0202917 A1* 7/2021 Lee ........................ G06F 3/0443

FOREIGN PATENT DOCUMENTS

| CN | 101114662 A | * | 1/2008 | |
| CN | 111512444 A | * | 8/2020 | ............. H04N 25/70 |

(Continued)

OTHER PUBLICATIONS

International Search Report and Written Opinion of PCT Application No. PCT/JP2021/001973, issued on Mar. 23, 2021, 09 pages of ISRWO.

*Primary Examiner* — Shahed Ahmed
(74) *Attorney, Agent, or Firm* — CHIP LAW GROUP

(57) ABSTRACT

A light emitting device includes: a substrate; a light emitting region including light emitting elements arranged in a matrix on the substrate; and a sealing portion located on the light emitting region. A single lens covering the light emitting region is formed in the sealing portion. Furthermore, a method for manufacturing a light emitting device includes: a step of forming a light emitting region including light emitting elements arranged in a matrix on a substrate; and a step of performing sealing by forming a single lens covering the light emitting region.

15 Claims, 24 Drawing Sheets

(58) Field of Classification Search
CPC .......... H10H 20/855–856; H10H 29/855–856;
H01L 25/0753; H01L 23/02; H01L
23/28–3192; H01L 21/56–568; H01L
2924/181–186; G02B 3/00; H05B 33/04
See application file for complete search history.

(56) References Cited

FOREIGN PATENT DOCUMENTS

| | | | | | |
|---|---|---|---|---|---|
| JP | 2004-039500 | A | 2/2004 | | |
| JP | 2012530272 | A | 11/2012 | | |
| JP | 2013-058447 | A | 3/2013 | | |
| JP | 2013-120731 | A | 6/2013 | | |
| JP | 2013535100 | A | 9/2013 | | |
| JP | 2016029720 | A | 3/2016 | | |
| JP | 2016519324 | A | 6/2016 | | |
| JP | 2017-009625 | A | 1/2017 | | |
| WO | WO-2017094777 | A1 * | 6/2017 | ............. | H04N 23/45 |
| WO | WO-2020111101 | A1 * | 6/2020 | ......... | H10K 59/8792 |

* cited by examiner

LIGHT EMITTING DEVICE, METHOD FOR MANUFACTURING LIGHT EMITTING DEVICE, AND ELECTRONIC DEVICE

CROSS REFERENCE TO RELATED APPLICATIONS

This application is a U.S. National Phase of International Patent Application No. PCT/JP2021/001973 filed on Jan. 21, 2021, which claims priority benefit of Japanese Patent Application No. JP 2020-028194 filed in the Japan Patent Office on Feb. 21, 2020. Each of the above-referenced applications is hereby incorporated herein by reference in its entirety.

TECHNICAL FIELD

The present disclosure relates to a light emitting device, a method for manufacturing the light emitting device, and an electronic device.

BACKGROUND ART

A light emitting element including a current-driven light emitting unit and a light emitting device including such a light emitting element are well known. For example, a light emitting element including a light emitting unit including an organic electroluminescence element (Hereinafter, there is a case where it is simply abbreviated as [organic EL light emitting unit].) has attracted attention as a light emitting element capable of high luminance light emission by low voltage direct current drive.

A light emitting device including a light emitting region including light emitting elements arranged in a matrix on a substrate is used, for example, for a purpose of emitting visible light to display an image, a purpose of emitting infrared light in a predetermined pattern to perform distance measurement, and the like. In a light emitting device that is attached to eyewear such as glasses or goggles to display an image, it is required to increase luminance in addition to setting a pixel size to about several micrometers to ten micrometers. For example, Patent Document 1 proposes that a microlens array is formed on a light emitting region to improve light extraction efficiency.

CITATION LIST

Patent Document

Patent Document 1: Japanese Patent Application Laid-Open No. 2004-39500

SUMMARY OF THE INVENTION

Problems to be Solved by the Invention

For example, in the light emitting device for eyewear, it is necessary to suitably adjust an emission direction of light from a light emitting region in order to enlarge a display image without distortion. The emission direction can also be adjusted by shifting a position of the microlens on the light emitting region for every light emitting element, but there remains a problem that utilization efficiency of light decreases.

Therefore, an object of the present disclosure is to provide a light emitting device capable of suitably adjusting an emission direction of light from a light emitting region and having excellent utilization efficiency of light, a method for manufacturing the light emitting device, and an electronic device including the light emitting device.

Solutions to Problems

A light emitting device according to the present disclosure for achieving the object described above is a light emitting device, including:
 a substrate;
 a light emitting region including light emitting elements arranged in a matrix on the substrate; and
 a sealing portion located on the light emitting region, in which
 a single lens covering the light emitting region is formed in the sealing portion.

A method for manufacturing a light emitting device according to the present disclosure for achieving the object described above is a method for manufacturing a light emitting device, including:
 a step of forming a light emitting region including light emitting elements arranged in a matrix on a substrate; and a step of performing sealing by forming a single lens covering the light emitting region.

An electronic device according to the present disclosure for achieving the object described above is an electronic device including a light emitting device, including:
 a substrate;
 a light emitting region including light emitting elements arranged in a matrix on the substrate;
 a sealing portion located on the light emitting region, in which
 a single lens covering the light emitting region is formed in the sealing portion.

BRIEF DESCRIPTION OF DRAWINGS

FIG. 2 is a schematic exploded perspective view for explaining a stacking relationship among a light emitting region, a color filter, and a single lens in the light emitting device.

FIG. 21 is a schematic cross-sectional view of a part of a light emitting device according to a sixth embodiment for explaining a structure of the light emitting device.

FIG. 22 is an external view of a lens interchangeable single lens reflex type digital still camera.

MODES FOR CARRYING OUT THE INVENTION

Figure 1:
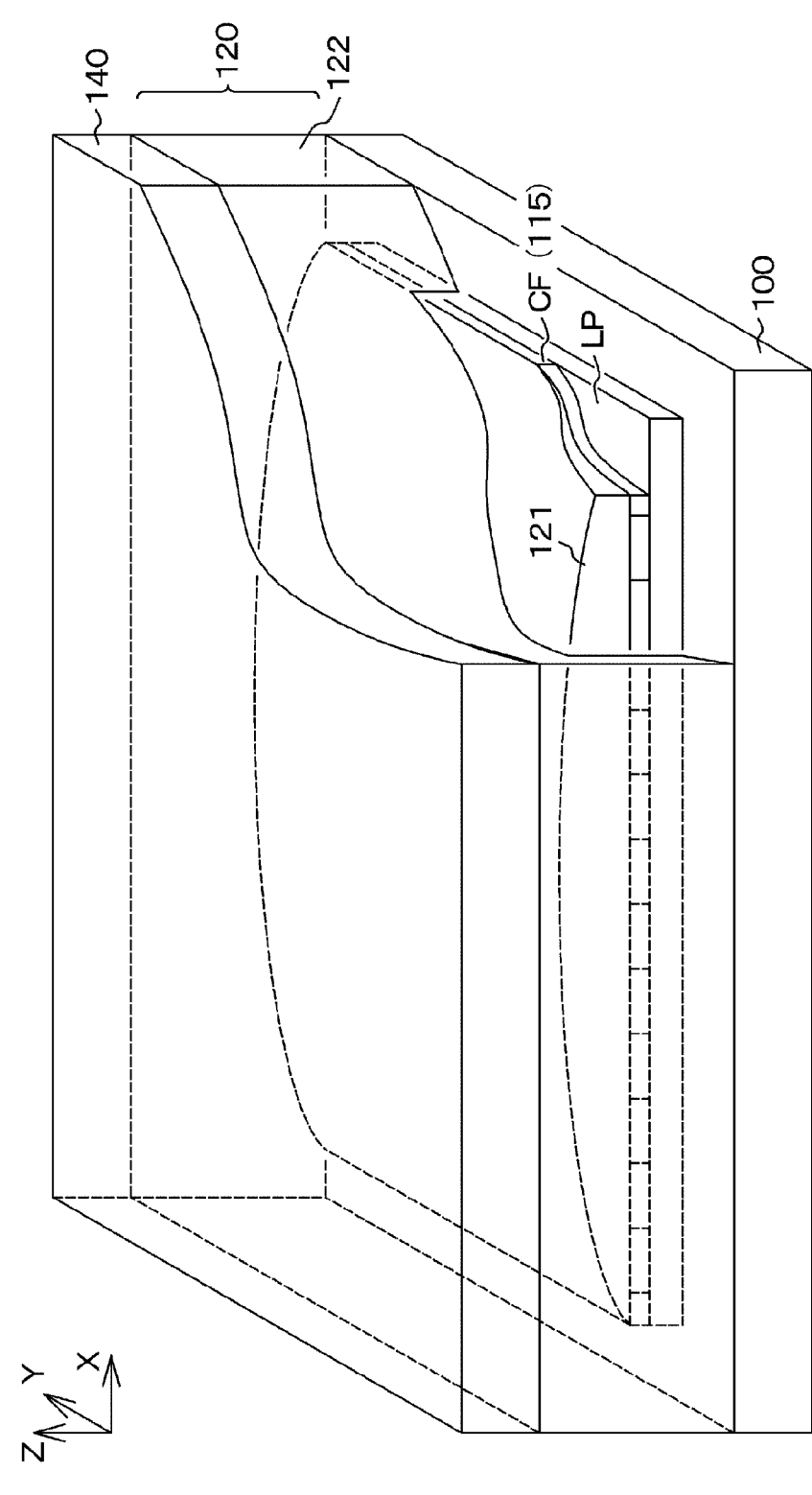
FIG. 1 is a schematic perspective view for explaining a light emitting device according to a first embodiment.

Hereinafter, the present disclosure will be described on the basis of embodiments with reference to the drawings. The present disclosure is not limited to the embodiments, and various numerical values and materials in the embodiments are examples. In the following description, the same elements or elements having the same functions are denoted by the same reference symbols, without redundant description. Note that the description will be given in the following order.

1. General Description of Light Emitting Device, Method for Manufacturing Light Emitting Device, and Electronic Device according to the Present Disclosure
2. First Embodiment
3. Second Embodiment
4. Third Embodiment
5. Fourth Embodiment
6. Fifth Embodiment
7. Sixth Embodiment
8. Description of Electronic Device
9. Others General Description of Light Emitting Device, Method for Manufacturing Light Emitting Device, and Electronic Device according to the Present Disclosure A light emitting device according to the present disclosure, a light emitting device used in an electronic device according to the present disclosure, and a light emitting device obtained by a method for manufacturing the light emitting device according to the present disclosure (Hereinafter, there is a case where these are simply referred to as a "light emitting device of the present disclosure.") is a light emitting device, including:

a substrate;

a light emitting region including light emitting elements arranged in a matrix on the substrate; and a sealing portion located on the light emitting region, in which a single lens covering the light emitting region is formed in the sealing portion.

In the light emitting device of the present disclosure, the single lens can be made of an organic material or an inorganic material. As the organic material, a polyimide-based resin, an acrylic resin, a novolac-based resin, or the like can be exemplified. As the inorganic material, silicon oxide, silicon oxynitride, silicon nitride, or the like can be exemplified. From the viewpoint of a sealing property, the single lens is preferably made of silicon oxide or silicon nitride. Note that the [single lens covering the light emitting region] includes not only a single lens covering the entire light emitting region but also a single lens covering a part of the light emitting region.

In the light emitting device of the present disclosure including the above-described various preferable configurations, a color filter can be formed between the light emitting region and the single lens. A configuration of the color filter is not particularly limited, and for example, the color filter can be formed by a known patterning method using a resin material containing a pigment corresponding to a display color.

In the light emitting device of the present disclosure including the various preferable configurations described above, the single lens can be formed by etching processing or nanoimprint processing. In a case of the etching processing, for example, it is sufficient if, after a material layer configuring a lens is formed, a mask corresponding to a lens shape is formed thereon, and dry etching is performed to transfer the lens shape to the material layer. Furthermore, in a case of the nanoimprint processing, it is sufficient if a mold corresponding to a lens shape is prepared, a light (including UV) curable or thermosetting resin is applied, pressing is performed with the mold, and thereafter, curing of the resin is performed.

In the light emitting device of the present disclosure including the above-described various preferable configurations, a counter substrate can be disposed on the sealing portion. As the counter substrate, a known material such as a transparent glass material or a resin material can be used. In this case, a space between the single lens and the counter substrate can be filled with an inorganic material or an organic material having a refractive index different from that of the material constituting the single lens. Alternatively, the space between the single lens and the counter substrate can be filled with a gas.

In the light emitting device of the present disclosure including the above-described various preferable configurations, a microlens corresponding to each of the light emitting elements can be formed between the light emitting region and the single lens. A configuration of the microlens is not particularly limited, and the microlens can be formed by a known patterning method.

In the light emitting device of the present disclosure including the above-described various preferable configurations, another single lens can be disposed on the single lens. For example, in a case where lens power is insufficient with the one single lens, it is possible to secure required lens power by disposing another single lens.

In the light emitting device of the present disclosure including the above-described various preferable configurations, the light emitting element can include a light emitting unit including an organic electroluminescence element, an LED element, a semiconductor laser element, and the like. These can be configured using well-known materials and methods. From the viewpoint of configuring a planar light emitting device, it is particularly preferable that the light emitting element has the light emitting unit including the organic electroluminescence element. Furthermore, the light emitting element may include a drive circuit for driving the light emitting unit. The light emitting unit and the drive circuit can be connected via, for example, a conductive portion including a via or the like provided in an interlayer insulating film.

In the light emitting device of the present disclosure including the above-described various preferable configurations, the single lens can have a rotationally symmetric shape. For example, a rotationally symmetric cylindrical lens or spherical lens can be used. Note that a configuration of a convex lens or a configuration of a concave lens may be used.

Alternatively, in the light emitting device of the present disclosure including the above-described various preferable configurations, the single lens can have a rotationally asymmetric shape. For example, in a case where 3D display is performed, it is conceivable that conditions of light collection and diffusion should be rotationally asymmetric in each of the light emitting element for a left eye and the light emitting element for a right eye. By forming the single lens into the rotationally asymmetric shape, it is possible to suitably cope with these applications.

As a constituent material of the substrate, a semiconductor material, a glass material, or a plastic material can be exemplified. In a case where the drive circuit includes a transistor formed on a semiconductor substrate, for example, a well region is only required to be provided on a semiconductor substrate made of silicon, and the transistor is only required to be formed in a well. On the other hand, in a case where the drive circuit includes a thin film transistor or the like, a semiconductor thin film can be formed on a substrate made of a glass material or a plastic material to form the drive circuit. Various wiring can have known configurations and structures.

In the light emitting device of the present disclosure, a configuration of the drive circuit or the like that controls light emission of the light emitting unit is not particularly limited. The light emitting unit can be formed in a certain plane on the substrate, for example, and can be disposed above the drive circuit that drives the light emitting unit via an interlayer insulating layer, for example. A configuration of the transistor configuring the drive circuit is not particularly limited. A p-channel field effect transistor or an n-channel field effect transistor may be used.

In the light emitting device of the present disclosure, the light emitting unit can be a so-called top emission type. For example, the light emitting unit including the organic electroluminescence element is configured by sandwiching an organic layer including a hole transport layer, a light emitting layer, an electron transport layer, and the like between a first electrode and a second electrode. In a case where a common cathode is used, the second electrode serves as a cathode electrode, and the first electrode serves as an anode electrode.

The first electrode is provided on the substrate for every light emitting unit. In a case where the common cathode is used, the first electrode functions as an anode electrode of the light emitting unit. The first electrode can be configured using a metal such as aluminum (Al), an aluminum alloy, platinum (Pt), gold (Au), chromium (Cr), or tungsten (W), an alloy thereof, and the like. Alternatively, a transparent conductive material layer such as indium tin oxide (ITO) or indium zinc oxide (IZO) and a reflective layer made of a light reflective material may be laminated.

The organic layer is formed by laminating a plurality of material layers, and is provided on an entire surface including the first electrode and a partition wall as a common continuous film. The organic layer emits light when a voltage is applied between the first electrode and the second electrode. The organic layer can have, for example, a structure in which a hole injection layer, a hole transport layer, a light emitting layer, an electron transport layer, and an electron injection layer are laminated in this order from the first electrode side. A hole transport material, the hole transport material, an electron transport material, and an organic light emitting material configuring the organic layer are not particularly limited, and known materials can be used.

The organic layer may include a structure in which a plurality of light emitting layers is laminated. For example, a light emitting unit that emits white light can be configured by laminating light emitting layers for red light emission, blue light emission, and green light emission, or by laminating light emitting layers for blue light emission and yellow light emission.

The light emitting device of the present disclosure can have a color display configuration. In a case of color display, the color filter can be formed using, for example, a resin material containing pigment or dye. Note that, in some cases, a so-called monochrome display configuration may be employed. In a case of monochrome display, one light emitting element constitutes one pixel.

Furthermore, in the case of color display, one light emitting element constitutes one subpixel. For example, one pixel can include a plurality of subpixels, specifically, one pixel can include three subpixels of a red display subpixel, a green display subpixel, and a blue display subpixel. Moreover, one set in which one or more types of subpixels are added to these three types of subpixels (for example, one set to which a subpixel that emits white light to improve luminance is added, one set in which a subpixel that emits complementary color to expand a color reproduction range is added, one set in which a subpixel that emits yellow to expand a color reproduction range is added, and one set in which a subpixel that emits yellow and cyan to expand a color reproduction range is added) can be included.

The partition wall defining the adjacent light emitting elements can be formed using a material appropriately selected from known inorganic materials and organic materials, and can be formed by, for example, a combination of a known film forming method such as a physical vapor deposition method (PVD method) exemplified by a vacuum vapor deposition method or a sputtering method or various chemical vapor deposition methods (CVD methods) and a known patterning method such as an etching method or a lift-off method.

As a value of a picture element (pixel) of the light emitting device, some image display resolutions such as (1920, 1035), (720, 480), (1280, 960), and the like in addition to VGA (640, 480), S-VGA (800, 600), XGA (1024, 768), APRC (1152, 900), S-XGA (1280, 1024), U-XGA (1600, 1200), HD-TV (1920, 1080), and Q-XGA (2048, 1536) can be exemplified, but the value is not limited to these values.

As the electronic device including the light emitting device of the present disclosure, various electronic devices having an image display function in addition to direct viewing type and projection type light emitting devices can be exemplified.

Various conditions in the present specification are satisfied not only in a case where they are strictly satisfied but also in a case where they are substantially satisfied. The presence of various variations caused by design or manufacturing is allowed. Furthermore, each drawing used in the following description is schematic, and does not indicate actual dimensions or ratios thereof.

First Embodiment

A first embodiment relates to a light emitting device and a method for manufacturing the light emitting device according to the present disclosure.

Figure 2:
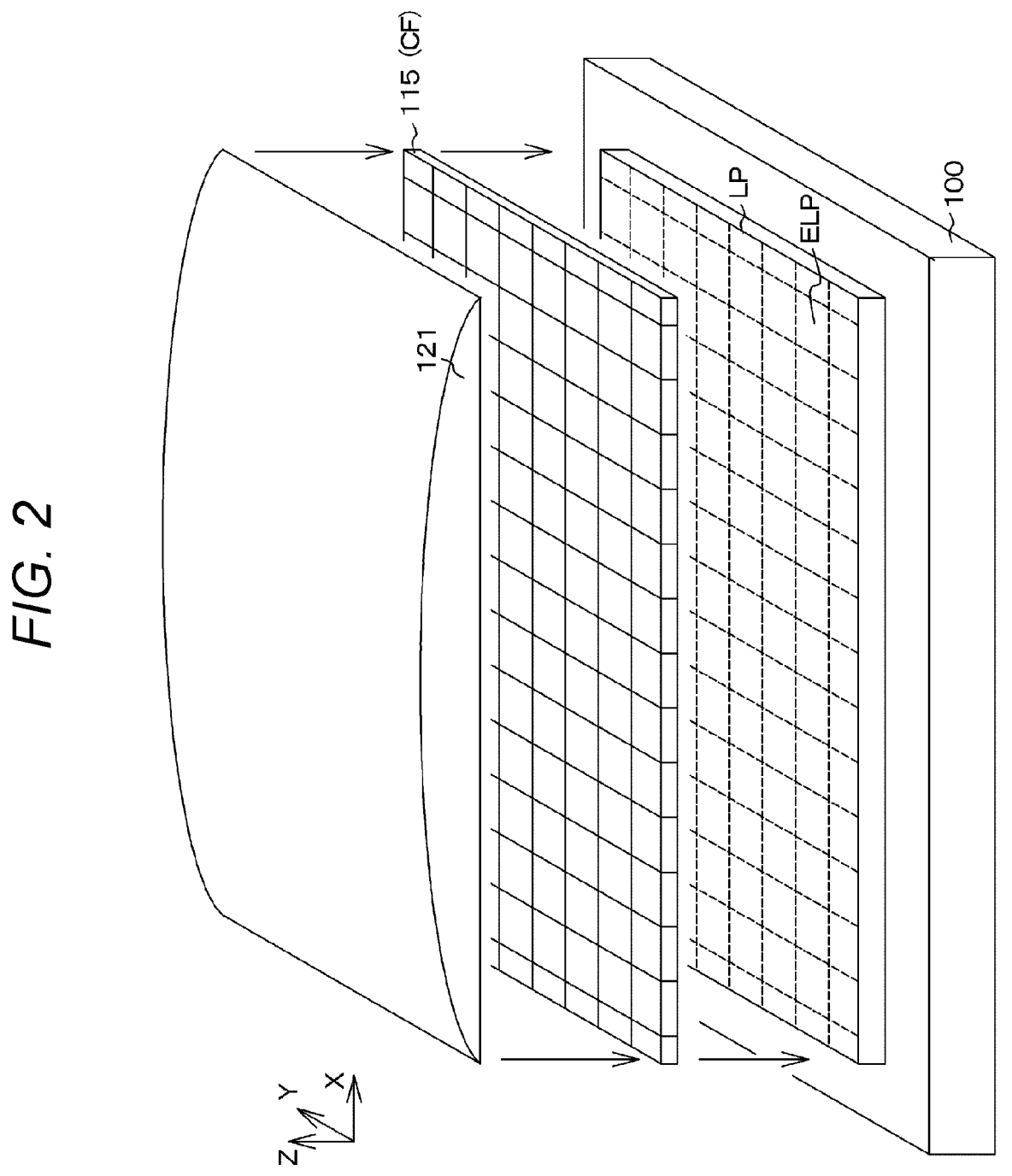

FIG. 1 is a schematic perspective view for explaining the light emitting device according to the first embodiment. FIG. 2 is a schematic exploded perspective view for explaining a stacking relationship among a light emitting region, a color filter, and a single lens in the light emitting device. In FIG. 1, a counter substrate and a sealing portion are partially cut away. Note that, for convenience of illustration, thickness of a light emitting element constituting the light emitting region, thickness of the color filter, thickness of the single lens, and the like are illustrated in an exaggerated state with respect to thickness of a substrate and the like. The same applies to the other drawings.

A light emitting device 1 includes a substrate 100, a light emitting region LP including light emitting elements ELP arranged in a matrix on the substrate 100, and a sealing portion 120 located on the light emitting region LP. Then, a single lens 121 covering the light emitting region LP is formed in the sealing portion 120. Although not limited, a diagonal dimension of the light emitting region LP is, for example, about one inch, and thickness of the single lens 121 is, for example, about several tens of micrometers to several hundreds of micrometers.

FIGS. 1 and 2 illustrate a cylindrical lens extending in a Y direction as an example of the single lens 121. As illustrated in FIG. 2, a color filter 115 is formed between the light emitting region LP and the single lens 121.

As illustrated in FIG. 1, a counter substrate 140 made of, for example, a glass material is disposed on the sealing portion 120. A space between the single lens 121 and the counter substrate 140 is filled with an inorganic material or an organic material having a refractive index different from that of a material constituting the single lens 121. Reference numeral 122 denotes a filler. As the filler, a transparent organic material or inorganic material may be appropriately selected and used.

Figures 3A, 3B:
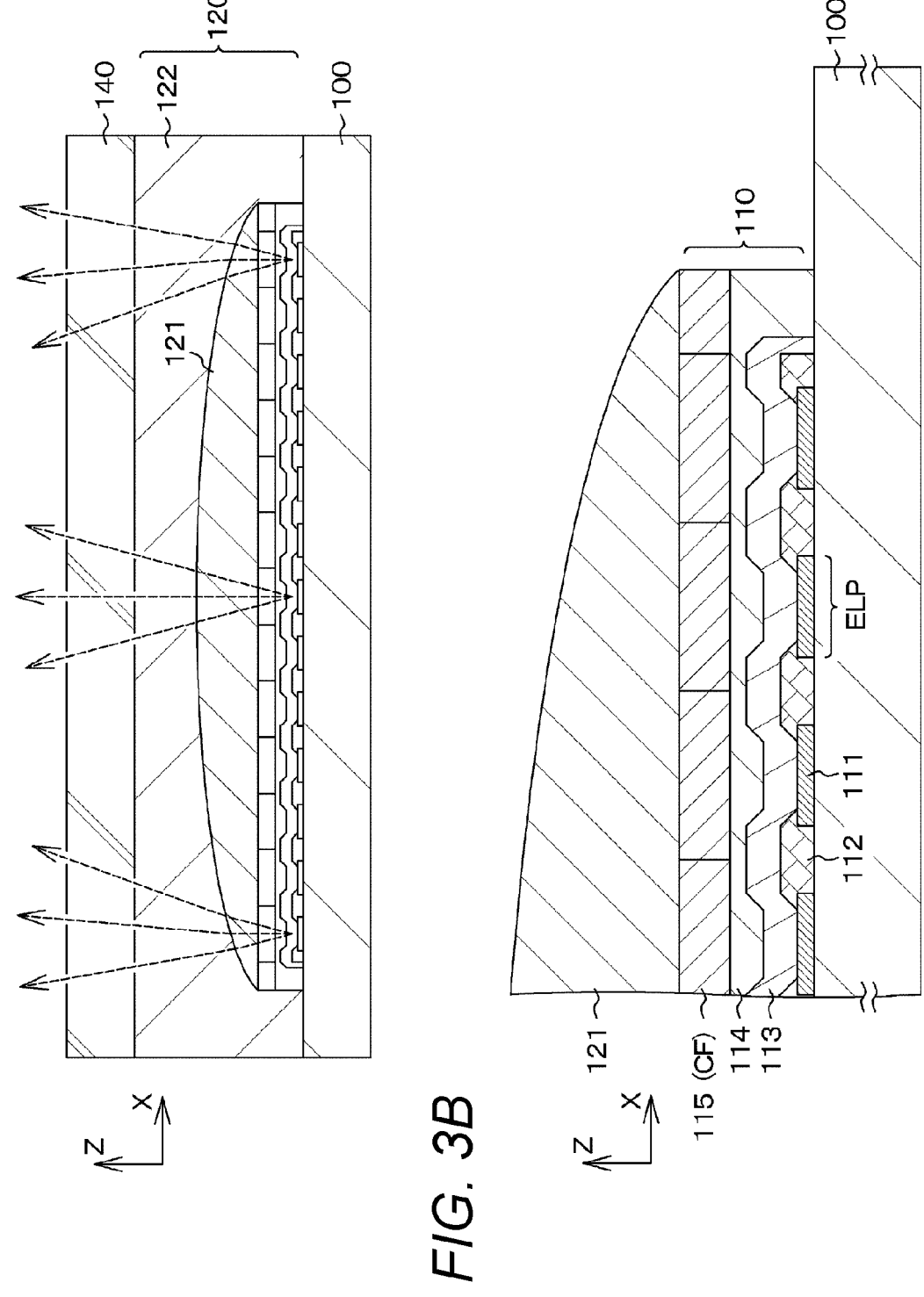
FIG. 3A is a schematic cross-sectional view of the light emitting device.
FIG. 3B is a schematic cross-sectional view of a part of the light emitting device for explaining a structure of a light emitting element, the color filter, and the single lens.

FIG. 3A is a schematic cross-sectional view of the light emitting device. FIG. 3B is a schematic cross-sectional view of a part of the light emitting device for explaining a structure of the light emitting element, the color filter, and the single lens.

The single lens 121 is used to adjust an emission direction of light from the light emitting region LP, more specifically, light from the light emitting element ELP. FIG. 3A illustrates an example of a case where the single lens 121 acts as a convex lens.

A basic configuration of the light emitting element ELP, the color filter 115, and the single lens 121 will be described with reference to FIG. 3B. The light emitting element ELP includes a light emitting unit including an organic electroluminescence element. The light emitting unit including the organic electroluminescence element is configured by sequentially laminating an organic layer including a light emitting layer, a second electrode, and a protective layer on a first electrode 111 provided for every light emitting element ELP. Note that, for convenience of illustration, the organic layer, the second electrode, and the protective layer are indicated by a single layer 113 in FIG. 3B. The protective layer is provided to prevent moisture from penetrating into the organic layer, and can be made of an organic material or an inorganic material. As the organic material, a polyimide-based resin, an acrylic resin, a novolac-based resin, or the like can be exemplified. As the inorganic material, silicon oxide, silicon oxynitride, silicon nitride, or the like can be exemplified. Note that, in order to enhance protection performance, a configuration in which the organic material and the inorganic material are laminated can be adopted. The organic layer is formed to emit white light. A planarization film 114 is formed on the layer 113.

A partition wall 112 made of an insulating material is provided between the first electrodes 111 adjacent to each other, whereby each light emitting element ELP is divided. Although not illustrated, a drive circuit provided for every light emitting element ELP is formed on the substrate 100. A light emitting state of the light emitting element ELP is controlled according to a signal from the outside.

The color filter 115 is formed on the planarization film 114. The color filter 115 is disposed to extract a target color from white light emitted by the light emitting element ELP. In a case where color display is performed, normally, one of three types of color filters of red, green, and blue is disposed corresponding to each light emitting element ELP. Reference numeral 110 indicates a portion where the color filter 115, the planarization film 114, and each layer constituting the light emitting unit ELP are stacked.

The single lens 121 is formed on the color filter 115. The single lens can be formed by etching processing or nano-imprint processing. Furthermore, the single lens 121 can be made of an organic material or an inorganic material. From the viewpoint of a sealing property, the single lens 121 is preferably made of silicon oxide or silicon nitride.

The basic configurations of the light emitting element ELP, the color filter 115, and the single lens 121 have been described above. Next, adjustment of an emission direction of light by the single lens 121 will be described.

Figure 4:
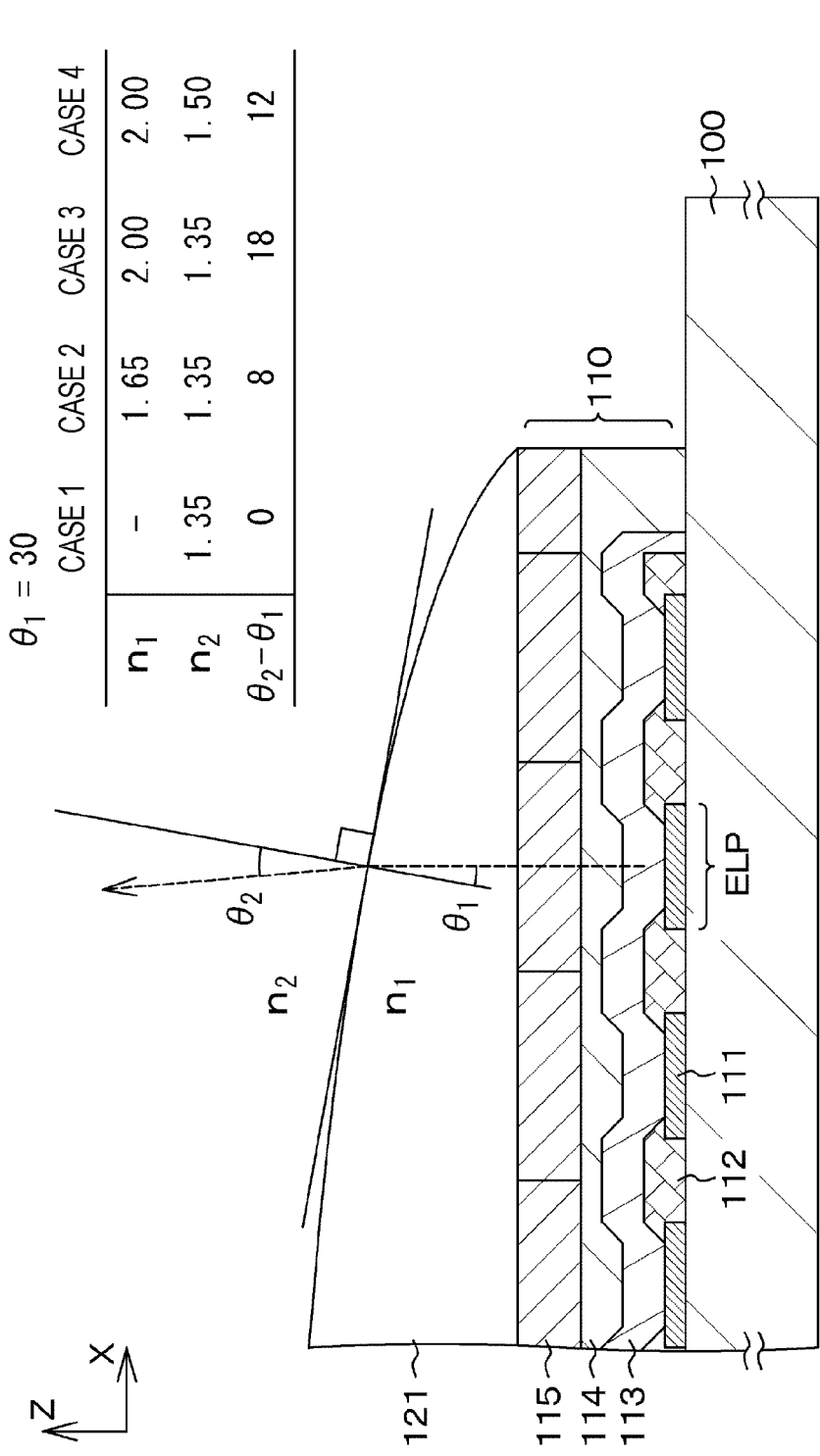
FIG. 4 is a schematic cross-sectional view of a part of the light emitting device for explaining adjustment of an emission direction of light by the single lens.

FIG. 4 is a schematic cross-sectional view of a part of the light emitting device for explaining adjustment of an emission direction of light by the single lens.

An adjustment amount (deflection angle) of the emission direction of light by the single lens 121 is determined by a curvature of a lens interface, an incident angle $\theta_1$ of light with respect to the lens interface, a refractive index $n_1$ of a material configuring the single lens 121, a refractive index n2 of a medium on an emission side, and the like. In FIG.

4, as an example, an example when the incident angle $\theta_1$ of the light with respect to the lens interface is 30 degrees is shown in a table.

Case 1 shown in the table of FIG. 4 illustrates a case where there is no single lens 121, the medium on the emission side (the filler 122 shown in FIG. 1) is an organic material, and its refractive index $n_2$ is 1.35. In this case, the deflection angle is zero degrees.

Case 2 illustrates a case where the single lens 121 is made of an organic material, the refractive index $n_1$ thereof is 1.65, and the refractive index $n_2$ of the medium on the emission side is 1.35. In this case, the deflection angle is eight degrees.

Case 3 illustrates a case where the single lens 121 is made of an inorganic material, the refractive index $n_1$ thereof is 2.00, and the refractive index $n_2$ of the medium on the emission side is 1.35. In this case, the deflection angle is 18 degrees.

Case 4 illustrates a case where the single lens 121 is made of an inorganic material, the refractive index $n_1$ thereof is 2.00, and the refractive index $n_2$ of the medium on the emission side is 1.50. In this case, the deflection angle is 12 degrees.

For the adjustment of the emission direction of the light by the single lens 121, the curvature of the lens interface, the material configuring the lens, and the material of the medium on the emission side are only required to be selected so as to obtain a necessary deflection angle according to the specification of the light emitting device 1. From the viewpoint of suppressing thickness of the single lens 121 while securing the deflection angle to some extent, it is preferable that the single lens 121 is made of an inorganic material, in particular, silicon oxide or silicon nitride, and the medium on the emission side is made of a resin material.

The adjustment of the emission direction of the light by the single lens has been described above. Subsequently, a method for manufacturing the light emitting device 1 according to the first embodiment will be described.

FIGS. 5A, 5B, 5C, 6A, 6B, 7A, 7B, and 8 are schematic partial end views for explaining the method for manufacturing the light emitting device according to the first embodiment.

As described below, the method for manufacturing the light emitting device 1 includes a step of forming a light emitting region including light emitting elements arranged in a matrix on a substrate, and a step of performing sealing by forming a single lens covering the light emitting region.

Figures 5A, 5B, 5C:
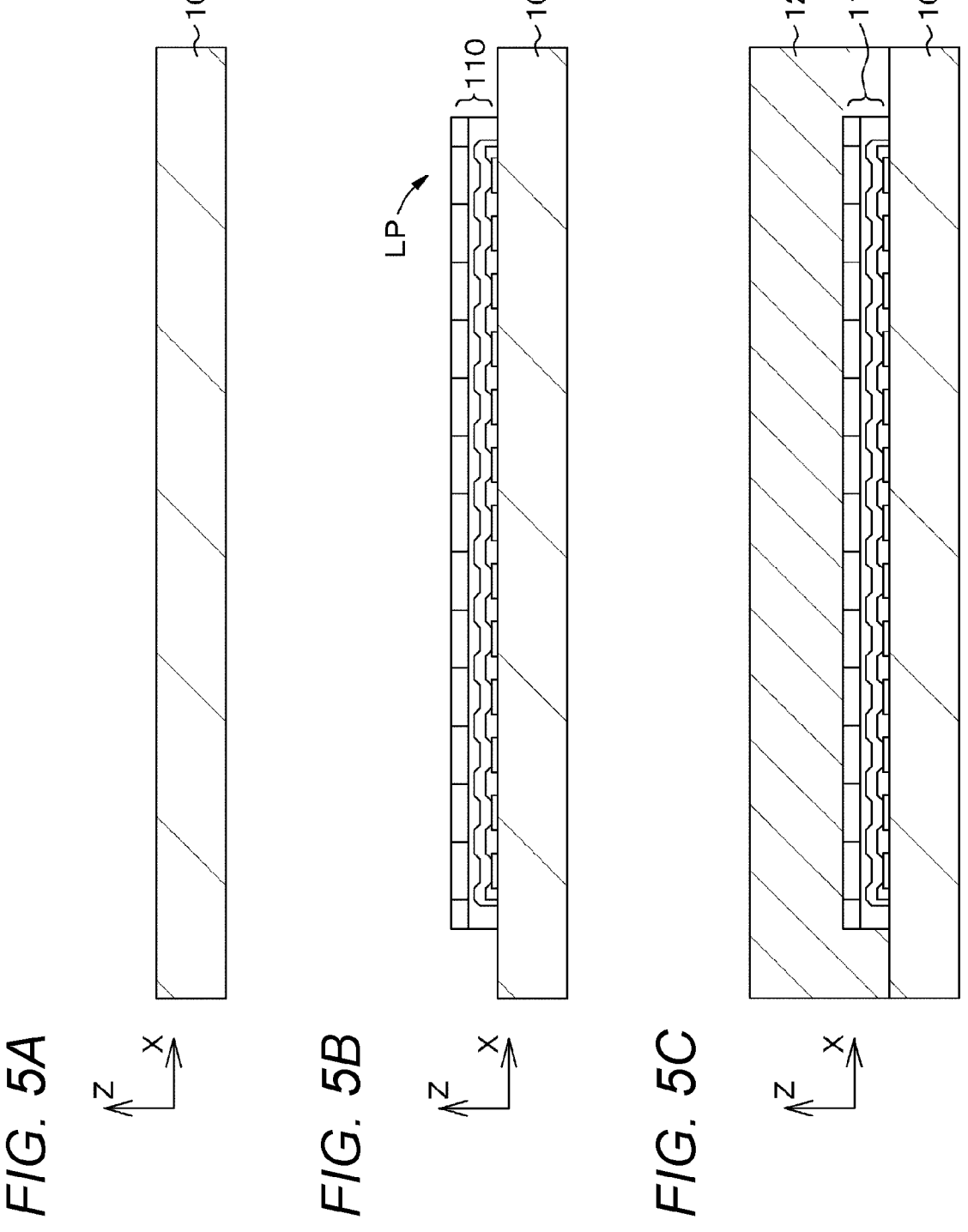
FIGS. 5A, 5B, and 5C are schematic partial end views for explaining a method for manufacturing the light emitting device according to the first embodiment.

[Step-100] (see FIGS. 5A and 5B)

The substrate 100 illustrated in FIG. 1 is prepared (see FIG. 5A), and the light emitting region LP including the light emitting elements ELP arranged in a matrix is formed on the substrate 100 (see FIG. 5B). Specifically, each layer constituting the light emitting unit ELP, the planarization film 114, and the color filter 115 are formed on the substrate 100 by a known method.

Figure 6A:
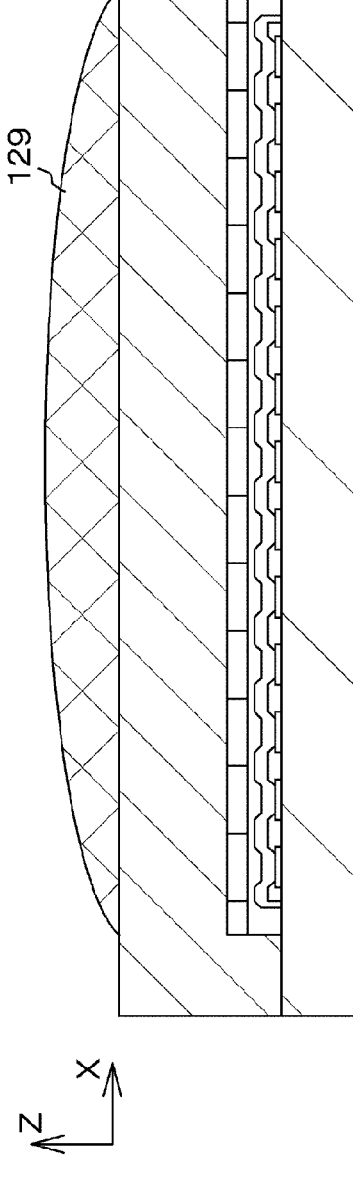
FIGS. 6A and 6B are schematic partial end views for explaining the method for manufacturing the light emitting device according to the first embodiment, following FIG. 5C.
Figure 6B:
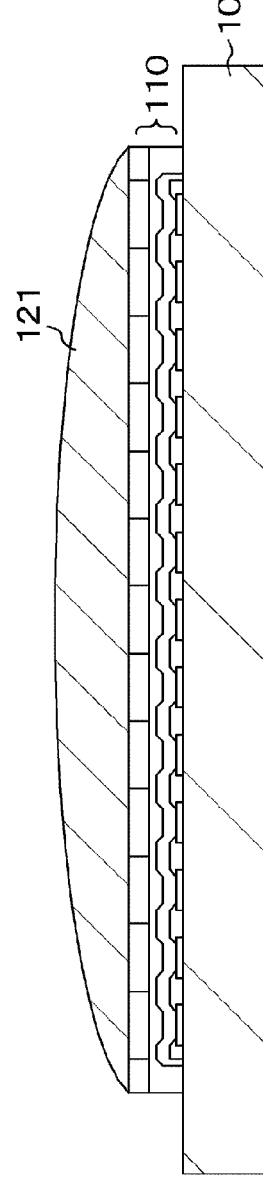

[Step-110] (See FIGS. 5C, 6A, and 6B)

Next, the single lens 121 covering the light emitting region LP is formed. First, a material layer 121' constituting the single lens 121 is formed on an entire surface including the color filter 115 (see FIG. 5C). Next, a resist 129 for forming a single lens is formed thereon. For example, the resist 129 following a shape of the single lens 121 is formed by gray-tone lithography (see FIG. 6A).

Thereafter, by performing, for example, dry etching processing, the etching processing is performed on the resist 129 and the material layer 121'. The thicker the resist 129, the smaller an etching amount of the material layer 121'. Therefore, the single lens 121 is formed by the material layer 121' to which the lens shape has been transferred (see FIG. 6B). Note that, in order to prevent exposure of a base in this etching processing, the material layer 121' may be formed after an etching stop film is formed.

Note that, in a case where the single lens 121 is formed by nanoimprint processing, it is sufficient if a mold corresponding to the lens shape is prepared, a light (including UV) curable or thermosetting resin is applied, pressing is performed with the mold, and thereafter, curing of the resin is performed.

Figure 7A:
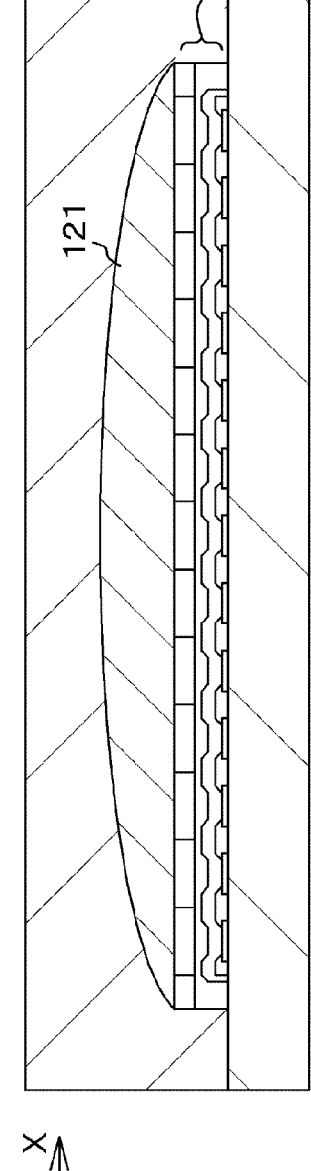
FIGS. 7A and 7B are schematic partial end views for explaining the method for manufacturing the light emitting device according to the first embodiment, following FIG. 6B.
Figure 7B:
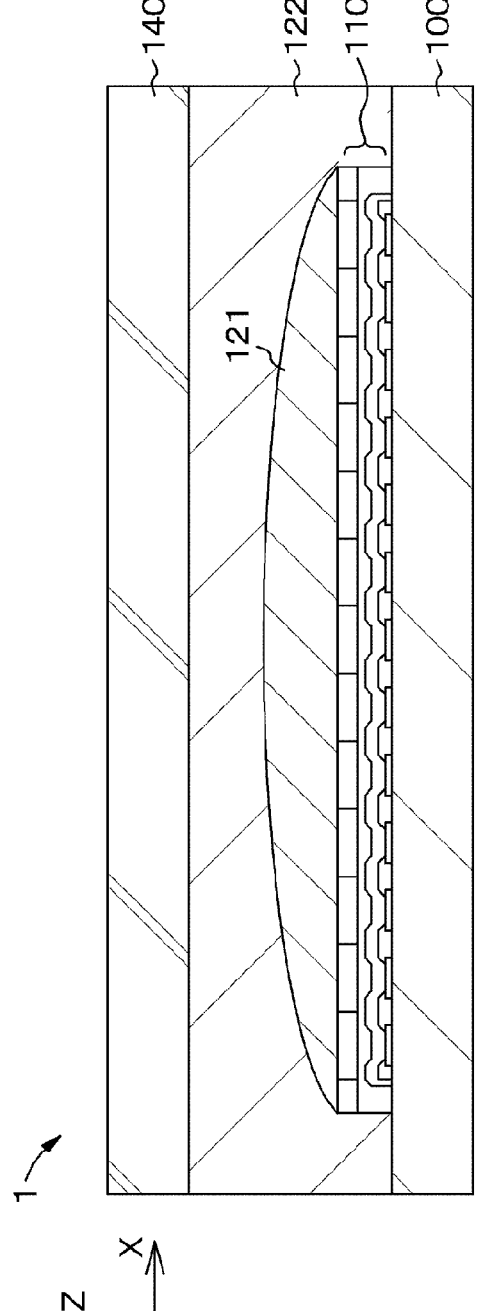

[Step-120] (see FIGS. 7A and 7B)

Thereafter, the filler 122 is applied to the entire surface (see FIG. 7A), and then the counter substrate 140 is disposed (see FIG. 7B). The light emitting device 1 can be obtained by the above steps.

The method for manufacturing the light emitting device 1 has been described above. Next, shape examples of the single lens will be described.

FIGS. 8 to 14 are schematic perspective views for explaining shape examples of the single lens.

Figure 8:
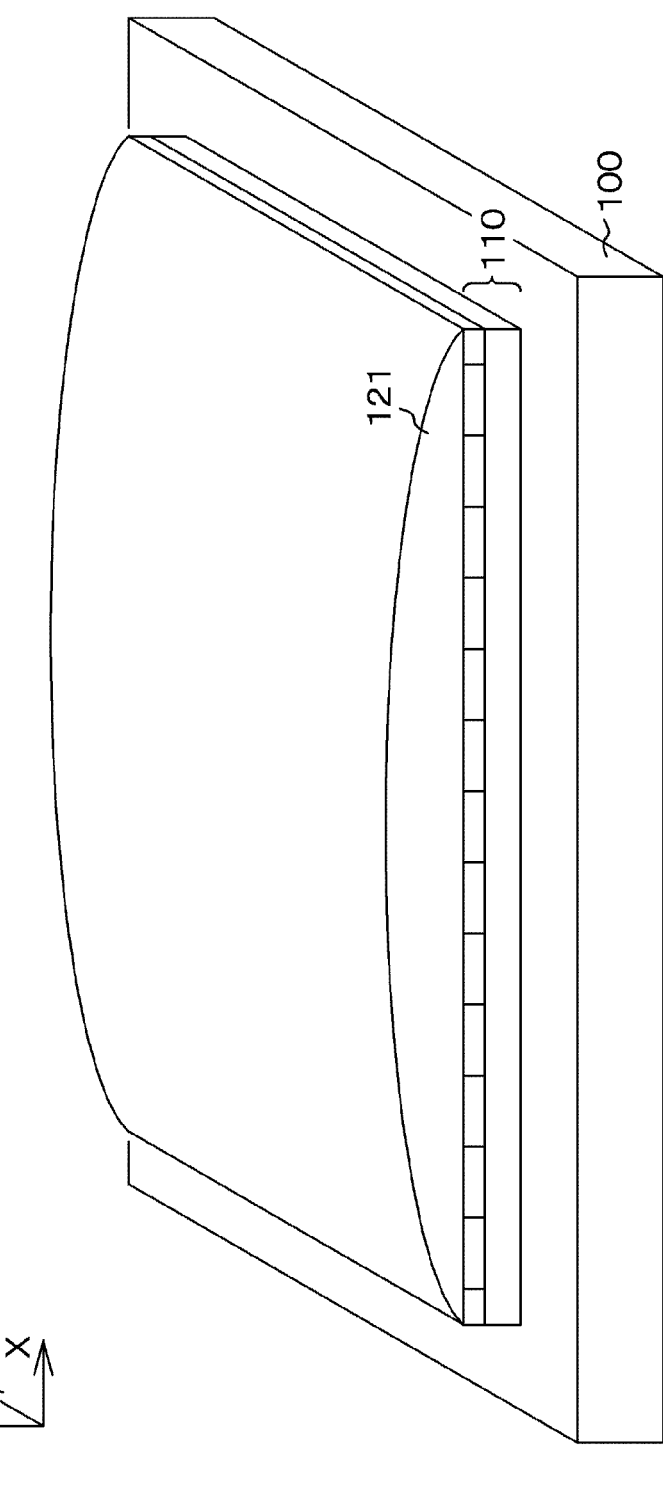
FIG. 8 is a schematic perspective view for explaining a shape of the single lens in the light emitting device.

In the above-described example, as illustrated in FIG. 8, the cylindrical lens 121 extending in the Y direction is illustrated as the example of the single lens. The shape of the single lens is not limited thereto, and the single lens can have a rotationally symmetric shape, or the single lens can have a rotationally asymmetric shape.

Figure 9:
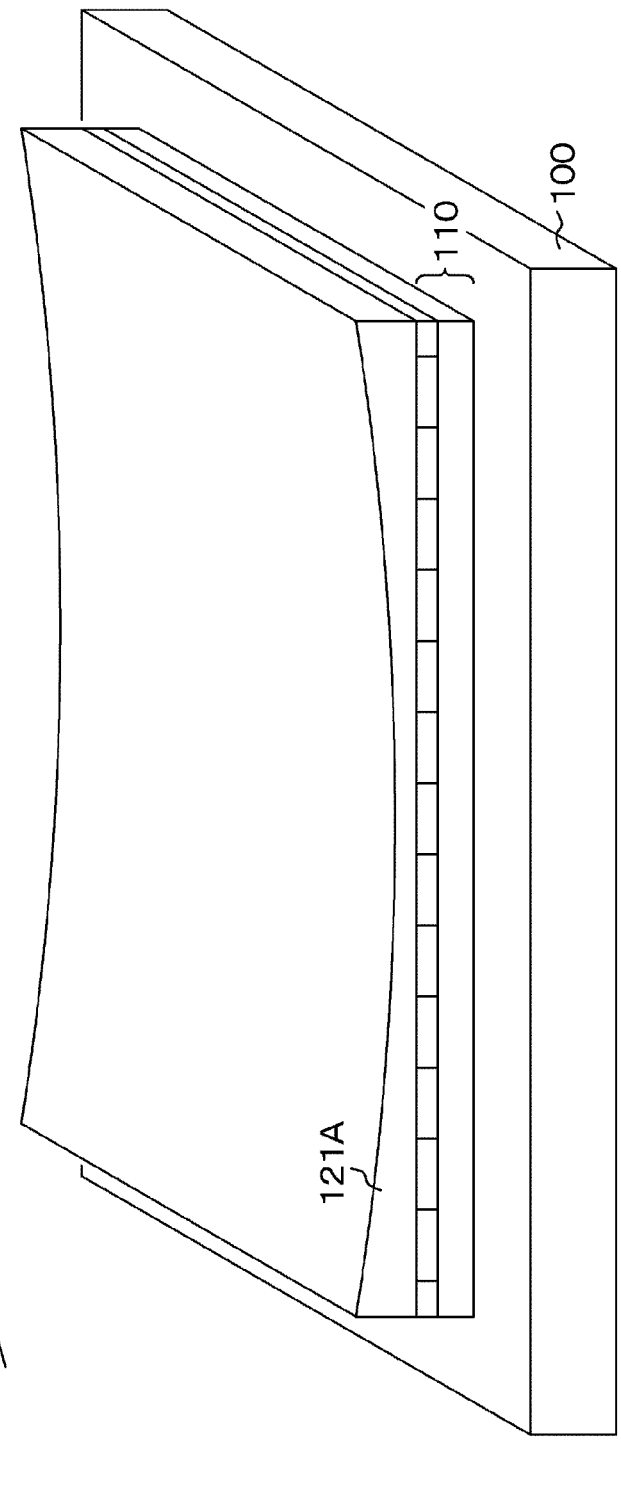
FIG. 9 is a schematic perspective view for explaining a shape of a single lens in the light emitting device, following FIG. 8.

FIG. 9 illustrates an example using a single lens 121A including a concave cylindrical lens extending in the Y direction. Although not illustrated, it is also possible to use a single lens including a concave cylindrical lens extending in an X direction.

Figure 10:
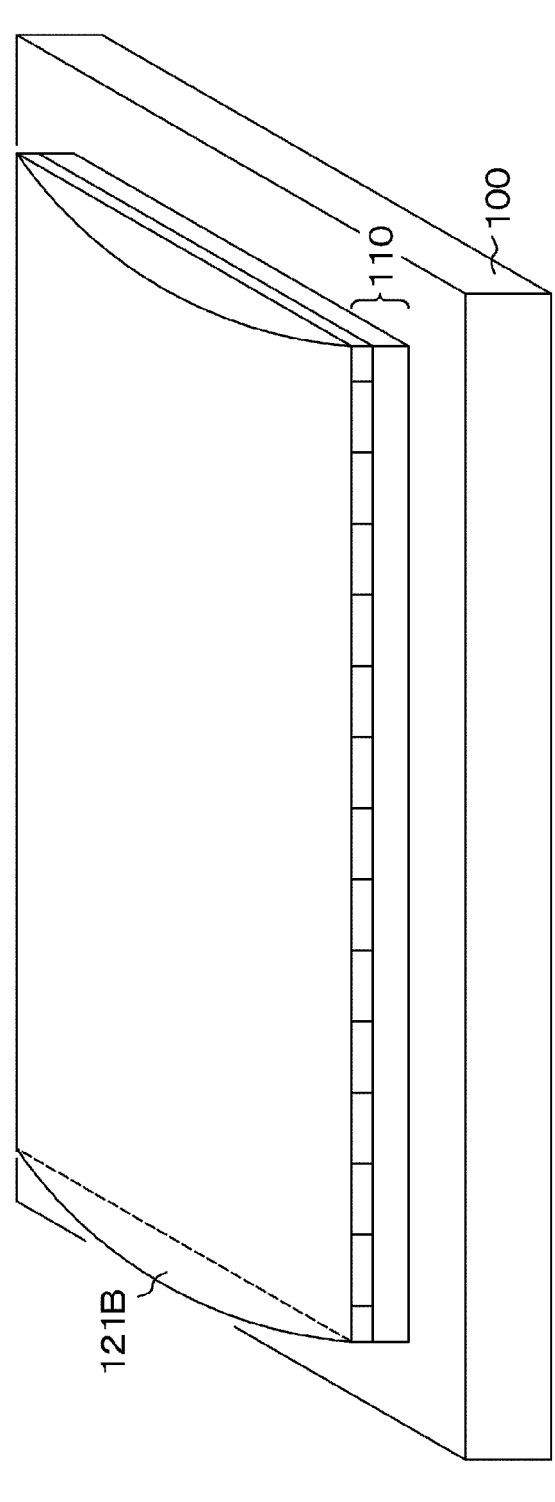
FIG. 10 is a schematic perspective view for explaining a shape of a single lens in the light emitting device, following FIG. 9.
Figure 11:
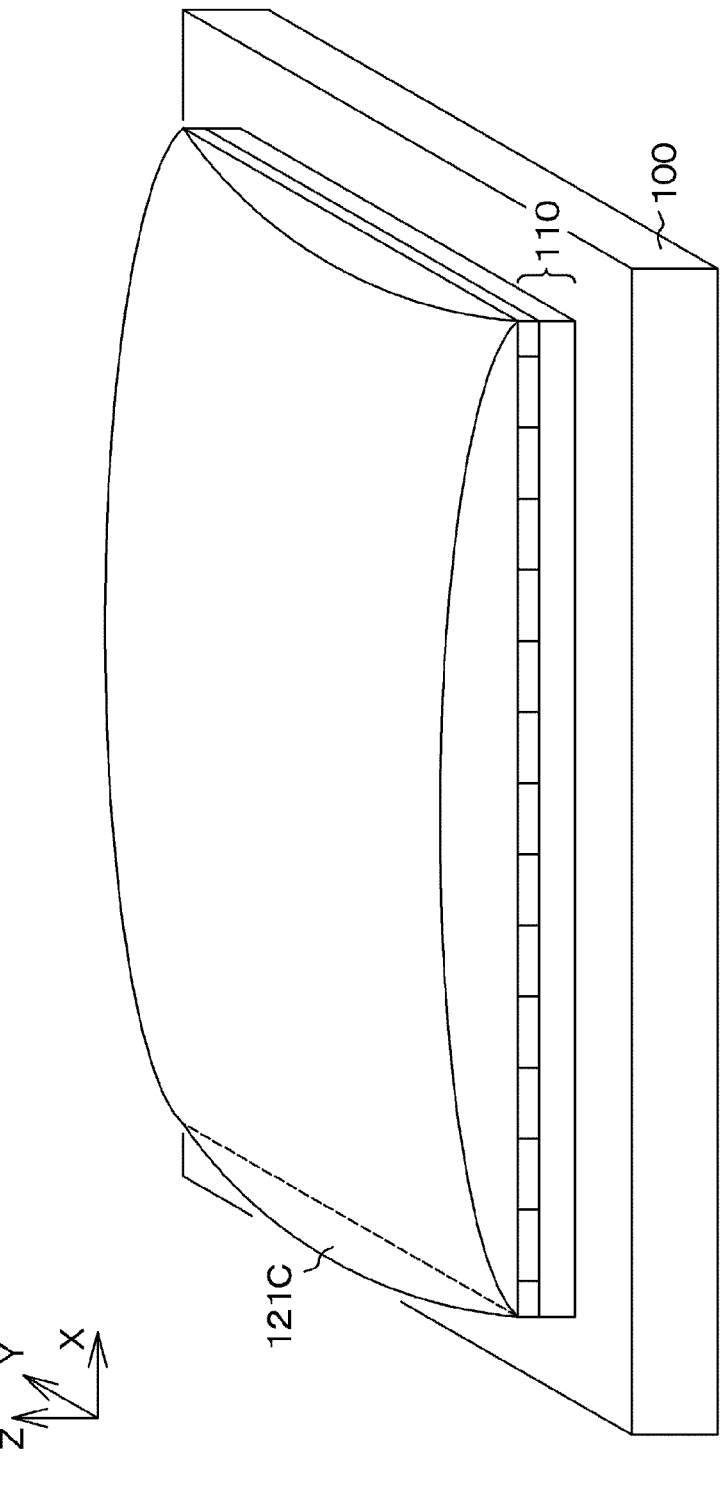
FIG. 11 is a schematic perspective view for explaining a shape of a single lens in the light emitting device, following FIG. 10.

FIG. 10 illustrates an example using a single lens 121B including a convex cylindrical lens extending in the X direction. FIG. 11 illustrates an example using a single lens 121C including a convex spherical lens.

Figure 12:
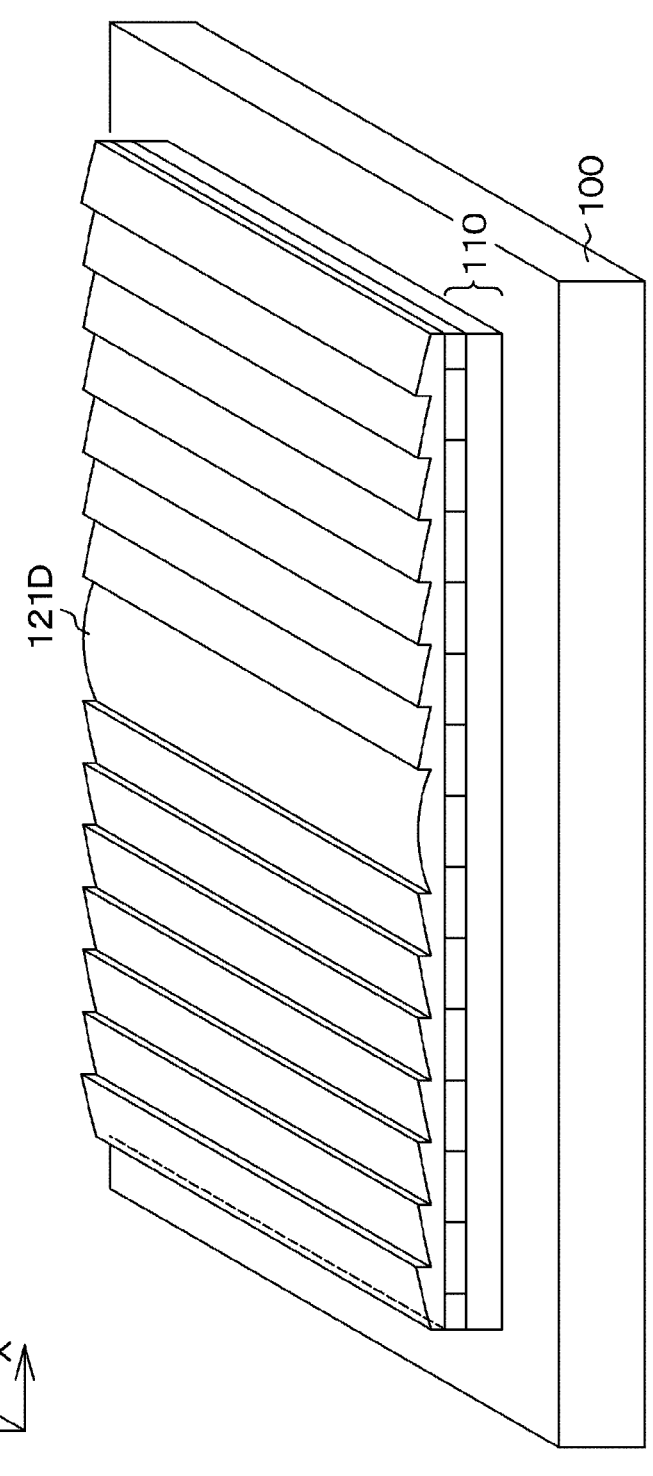
FIG. 12 is a schematic perspective view for explaining a shape of a single lens in the light emitting device, following FIG. 11.

FIG. 12 illustrates an example using a single lens 121D having a Fresnel structure extending in the Y direction. Although not illustrated, it is also possible to use a single lens having a Fresnel structure extending in the X direction or a single lens having a circular Fresnel structure.

Figure 13:
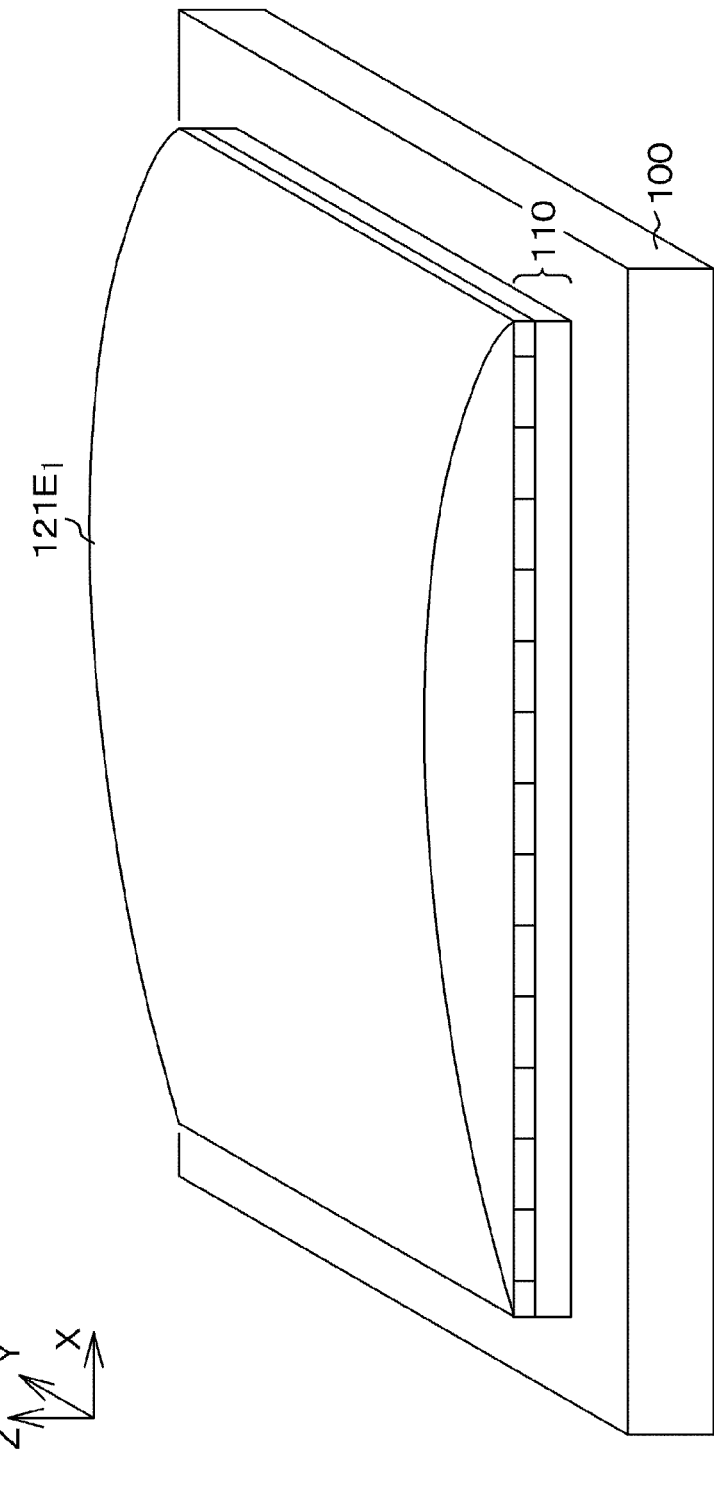
FIG. 13 is a schematic perspective view for explaining a shape of a single lens in the light emitting device, following FIG. 12.
Figure 14:
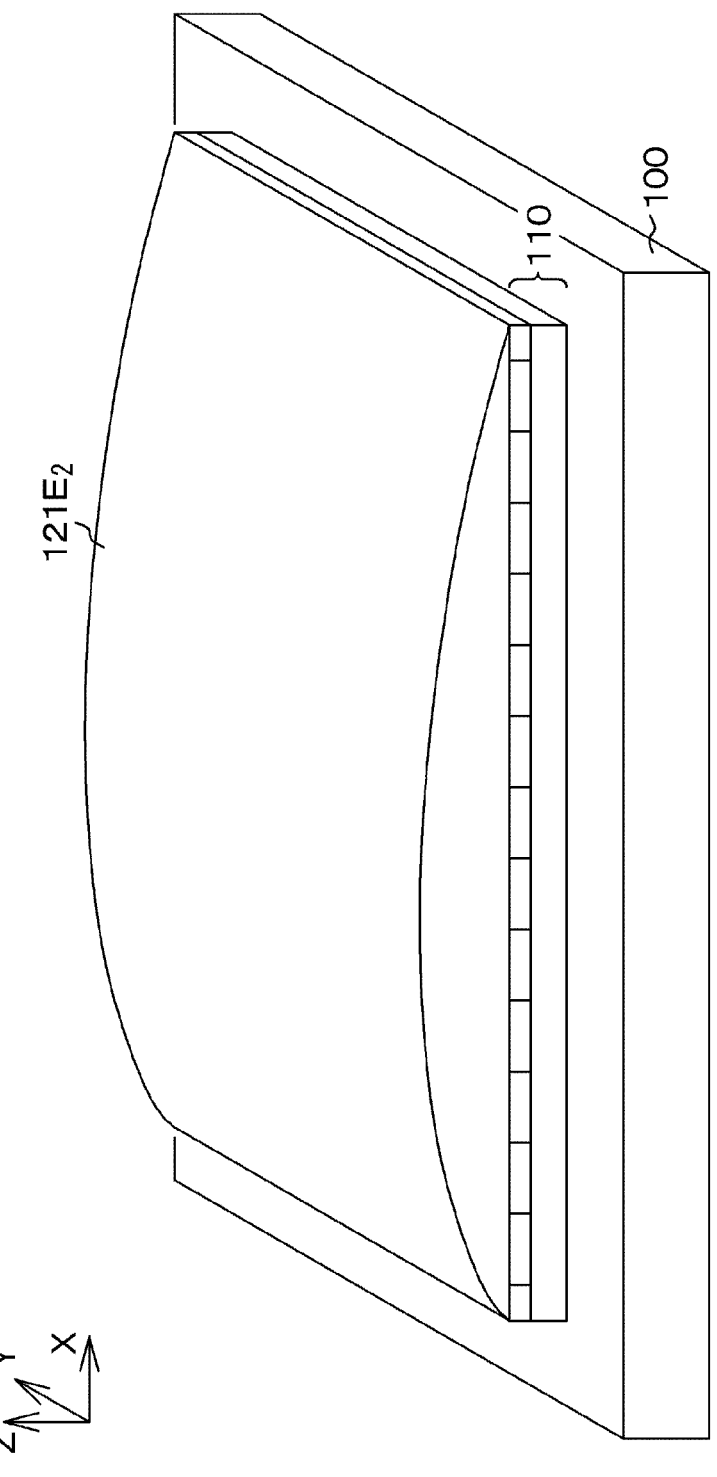
FIG. 14 is a schematic perspective view for explaining a shape of a single lens in the light emitting device, following FIG. 13.

FIGS. 13 and 14 illustrate an example using paired rotationally asymmetric single lenses $121E_1$ and $121E_2$, respectively. This configuration is suitable, for example, for an application in which it is desired to impart asymmetry of light collection conditions to each of a right eye and a left eye.

Second Embodiment

A second embodiment also relates to a light emitting device and a method for manufacturing the light emitting device according to the present disclosure.

In the first embodiment, the space between the single lens and the counter substrate is filled with the inorganic material or the organic material having the refractive index different from that of the material constituting the single lens. On the other hand, in the second embodiment, the space between the single lens and the counter substrate is filled with a gas. Except for the above points, a configuration is similar to that of the first embodiment.

Figure 15:
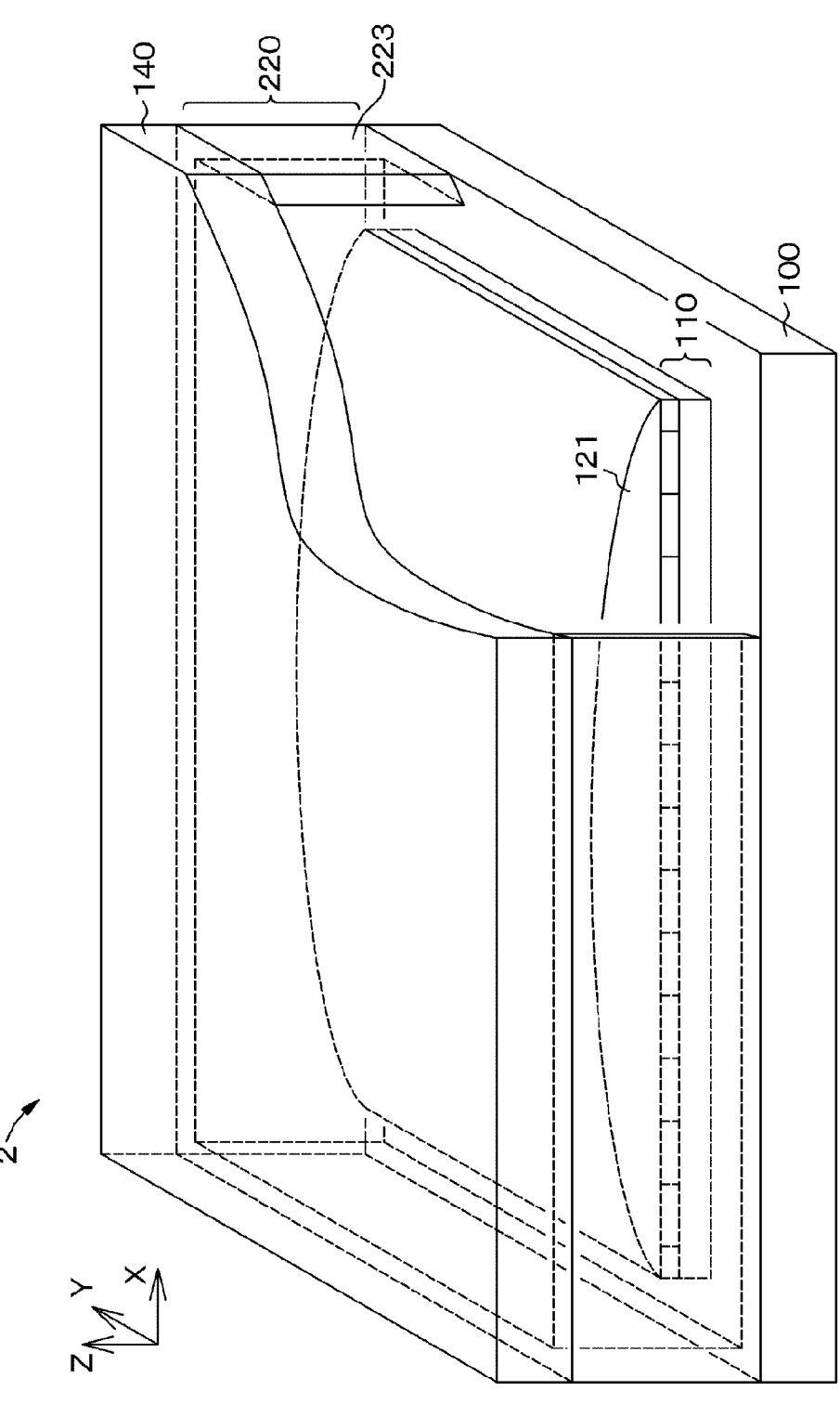
FIG. 15 is a schematic perspective view for explaining a light emitting device according to a second embodiment.
Figure 16:
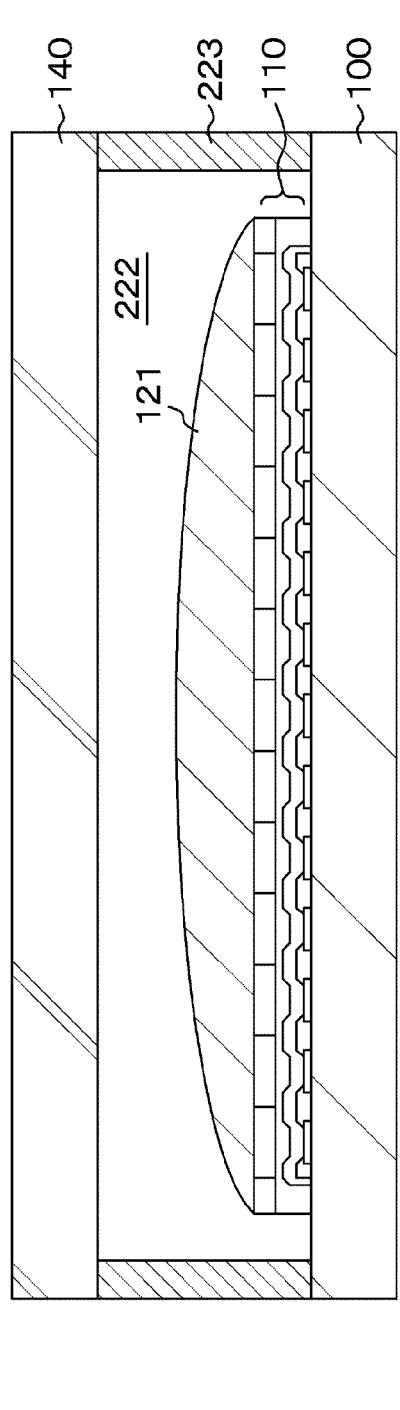
FIG. 16 is a schematic cross-sectional view of the light emitting device.

FIG. 15 is a schematic perspective view for explaining the light emitting device according to the second embodiment. FIG. 16 is a schematic cross-sectional view of the light emitting device.

In a light emitting device 2 according to the second embodiment, reference numeral 220 denotes a sealing portion. In the light emitting device 2, a seal portion 223 is disposed around the substrate 100, and the counter substrate 140 is disposed thereon. For example, the atmosphere is sealed in a space 222 surrounded by the seal portion 223 and the counter substrate 140.

The light emitting device 2 can be manufactured by, for example, the following steps.

Step-200

[Step-100] and [Step-110] described in the first embodiment are performed to form the light emitting element ELP, the color filter, and the single lens 121 on the substrate 100.

Step-210

Next, the seal portion 223 made of, for example, a photocurable material is applied around the substrate 100. Thereafter, the counter substrate 140 is disposed in the atmosphere. Note that the seal portion 223 may contain a predetermined spacer material in order to maintain an interval between the counter substrate 140 and the substrate 100. Next, the light emitting device 2 can be obtained by performing predetermined curing treatment on the seal portion 223.

Third Embodiment

A third embodiment also relates to a light emitting device and a method for manufacturing the light emitting device according to the present disclosure.

In the first embodiment, the counter substrate is disposed facing the substrate, and the filler is disposed therebetween. On the other hand, the third embodiment is mainly different in that a counter substrate and a filler are omitted.

Figures 17A, 17B:
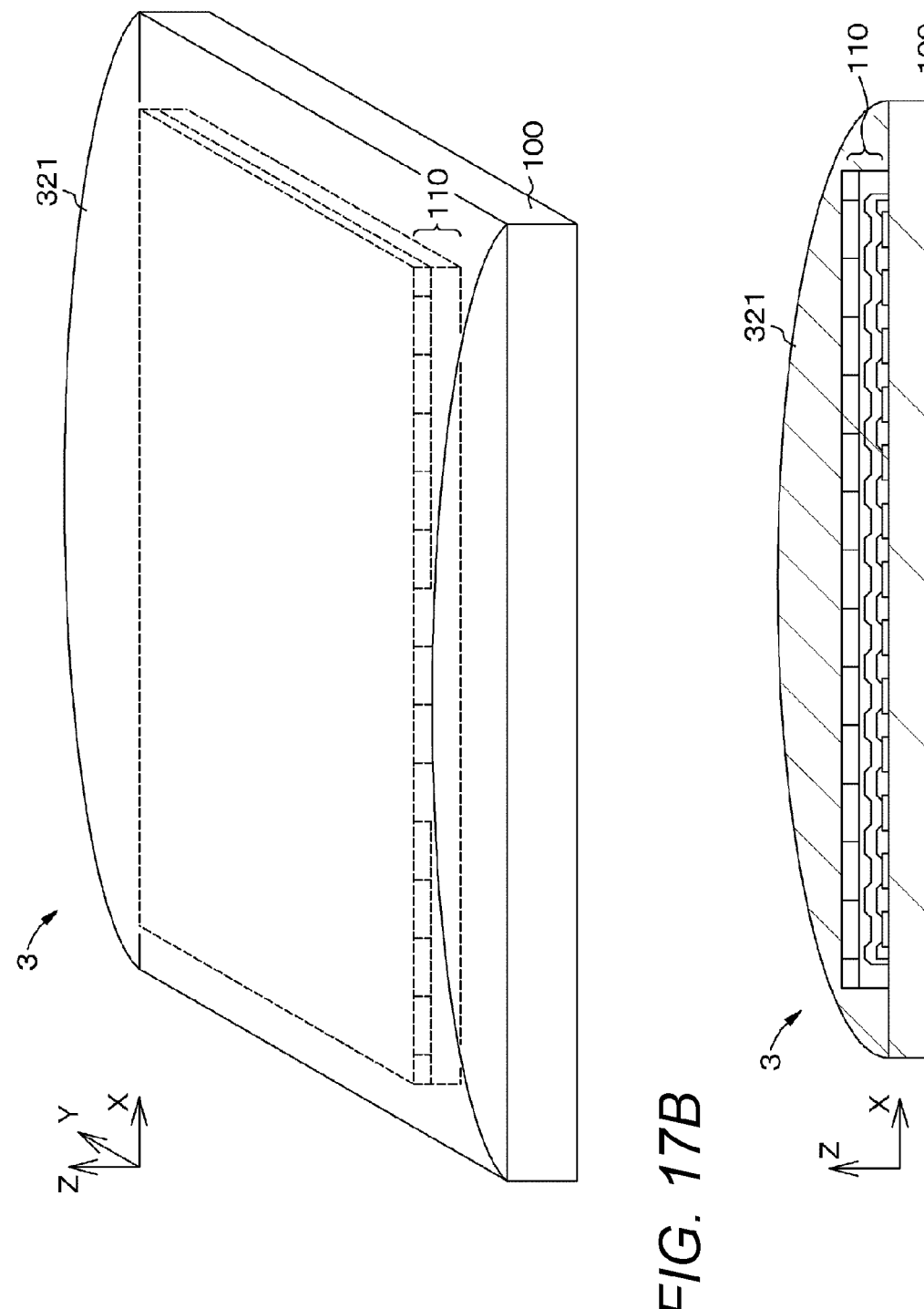
FIG. 17A is a schematic perspective view of a light emitting device according to a third embodiment.
FIG. 17B is a schematic cross-sectional view of the light emitting device.

FIG. 17A is a schematic perspective view of the light emitting device according to the third embodiment. FIG. 17B is a schematic cross-sectional view of the light emitting device.

In a light emitting device 3 according to the third embodiment, a single lens 321 is formed to extend around the substrate 100, for example. If the single lens 321 is formed of an inorganic material such as silicon oxide or silicon nitride, sufficient sealing can be performed by the single lens 321 itself.

Substantially, since the method for manufacturing the light emitting device 3 is only required to perform [Step-100] and [Step-110] described in the first embodiment, description thereof is omitted.

Fourth Embodiment

A fourth embodiment also relates to a light emitting device and a method for manufacturing the light emitting device according to the present disclosure.

In the first embodiment, one single lens is disposed in the light emitting device. On the other hand, the fourth embodiment is different in that another single lens is disposed on the single lens. For example, in a case where lens power is insufficient with the one single lens, it is possible to secure required lens power by disposing another single lens.

Figure 18:
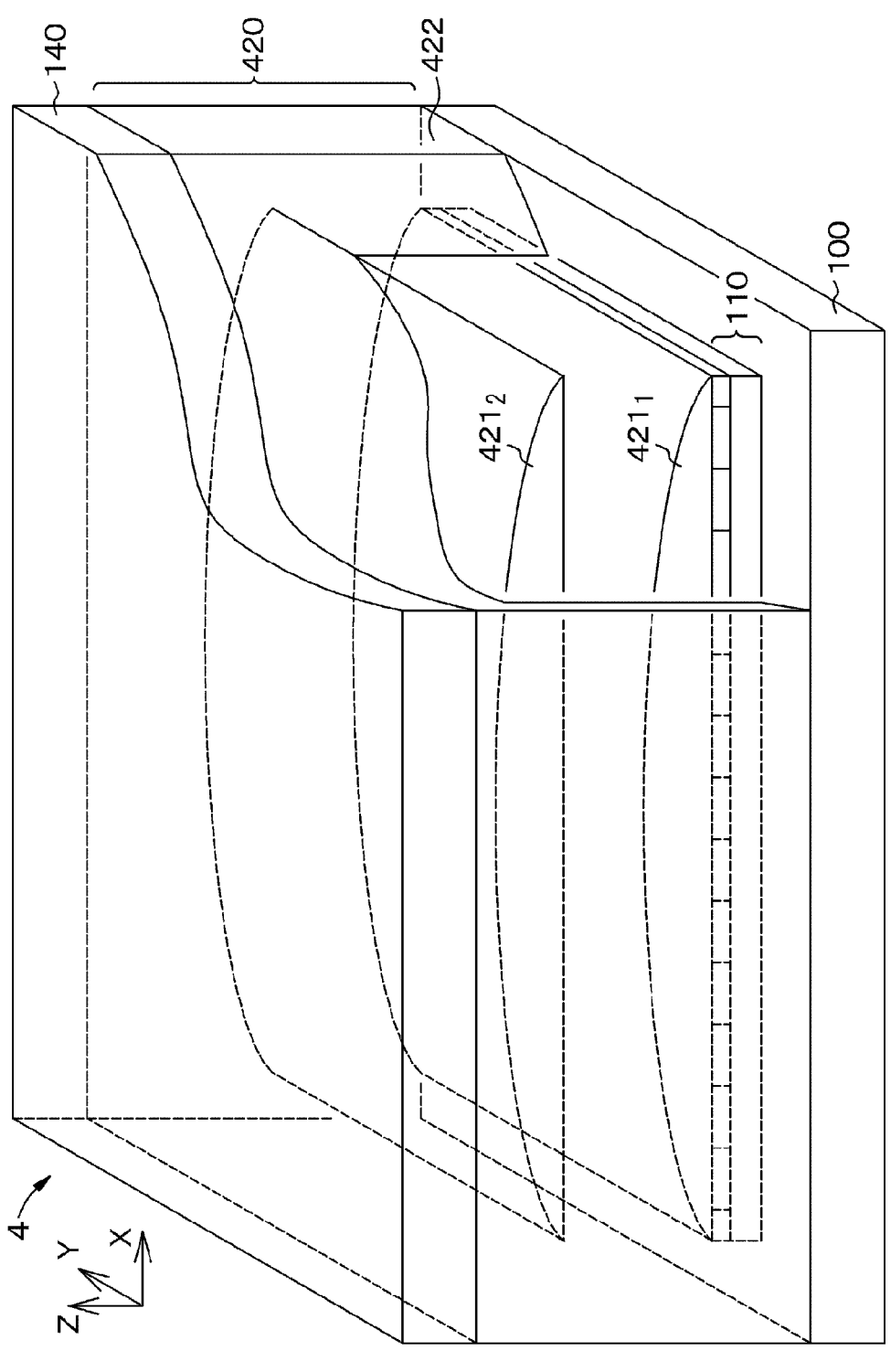
FIG. 18 is a schematic perspective view for explaining a light emitting device according to a fourth embodiment.
Figure 19:
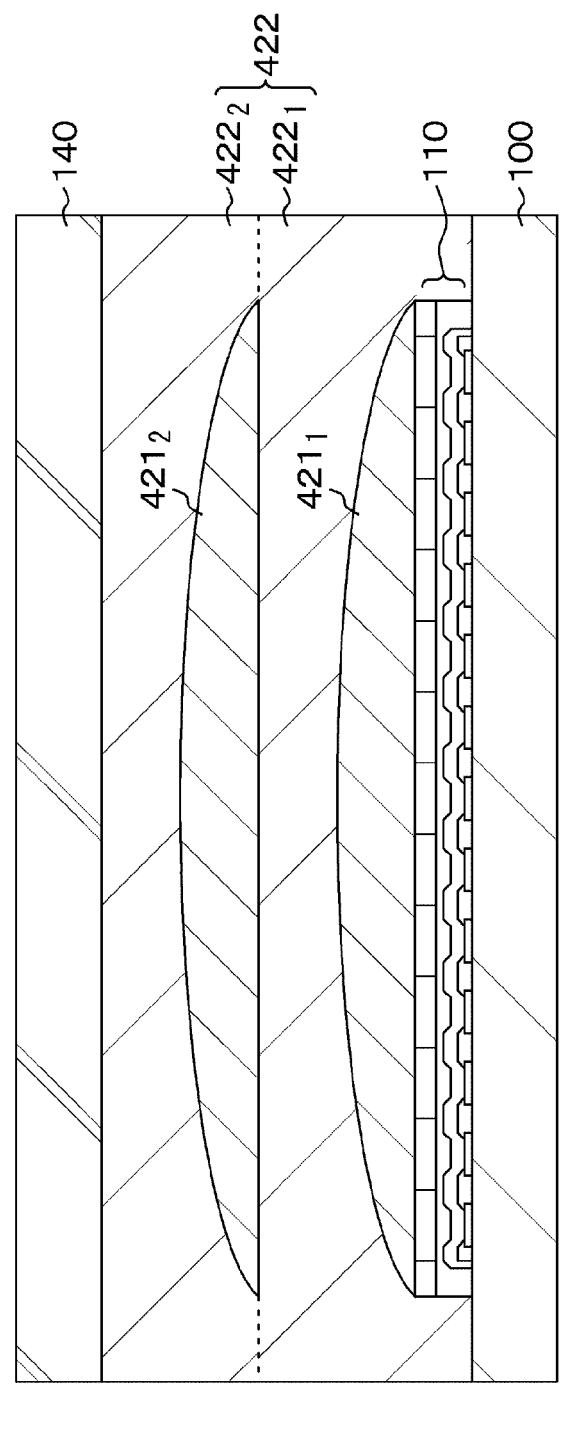
FIG. 19 is a schematic cross-sectional view of the light emitting device.

FIG. 18 is a schematic perspective view for explaining the light emitting device according to the fourth embodiment. FIG. 19 is a schematic cross-sectional view of the light emitting device.

In a light emitting device 4, reference numeral 420 denotes a sealing portion. Another single lens 421₂ is disposed on a single lens 421₁ corresponding to the lens 121 in the light emitting device 1. A space between the counter substrate 140 and the substrate 100 is filled with a filler 422. The filler 422 has a two-layer structure including fillers 422₁ and 422₂ as described later.

The light emitting device 4 can be manufactured by, for example, the following steps.

Step-400

[Step-100] and [Step-110] described in the first embodiment are performed to form the light emitting element ELP, the color filter, and the single lens 421₁ on the substrate 100.

Step-410

After the filler 422₁ is applied to an entire surface, planarization processing is performed. Then, a step similar to [Step-110] is performed on the filler 422₁ to form the single lens 421₂. Thereafter, the filler 422₂ is applied, and then the counter substrate 140 is disposed. The light emitting device 4 can be obtained by the above steps.

Fifth Embodiment

A fifth embodiment also relates to a light emitting device and a method for manufacturing the light emitting device according to the present disclosure.

Figure 20:
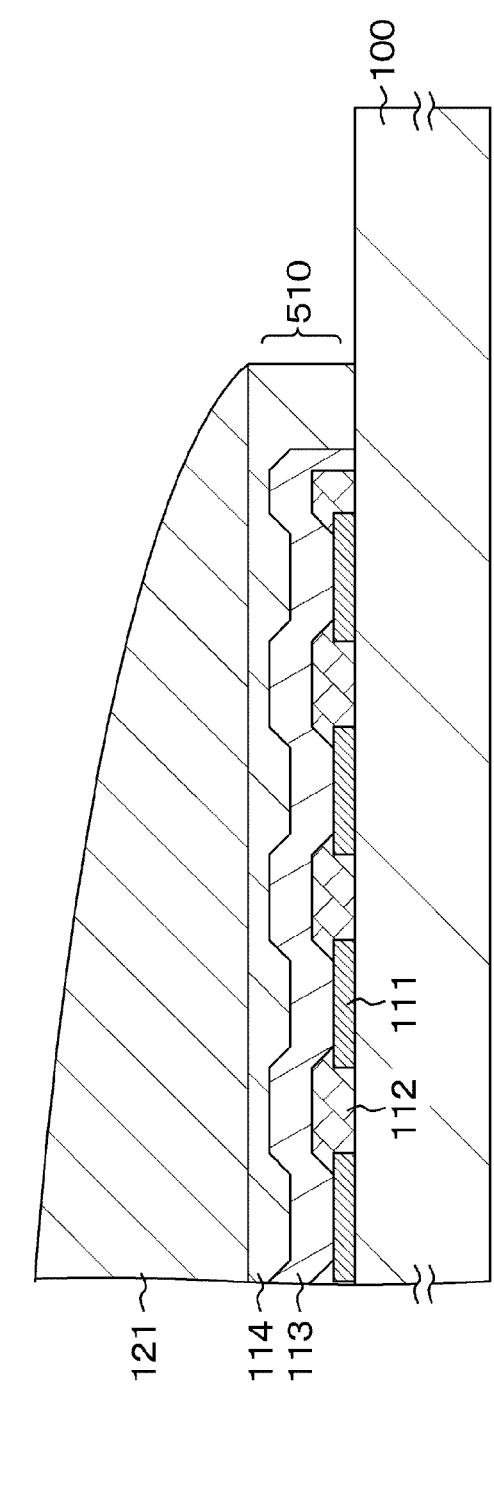
FIG. 20 is a schematic cross-sectional view of a part of a light emitting device according to a fifth embodiment for explaining a structure of the light emitting device.

FIG. 20 is a schematic cross-sectional view of a part of the light emitting device for explaining the structure of the light emitting device according to the fifth embodiment. In the schematic perspective view of a light emitting device 5 according to the fifth embodiment, the light emitting device 1 is only required to be read as the light emitting device 5 in a state in which the color filter is removed in FIG. 1.

The light emitting device 5 according to the fifth embodiment has, for example, a configuration in which the color filter 115 is omitted in the light emitting device 1 of the first embodiment. In a stacked portion indicated by reference numeral 510 in FIG. 20, the color filter is omitted, and the single lens 121 is formed on the planarization film 114.

Since the method for manufacturing the light emitting device 5 is similar to [Step-100] to [Step-120] described in the first embodiment except that the formation of the color filter is omitted, description thereof is omitted.

Sixth Embodiment

A sixth embodiment also relates to a light emitting device and a method for manufacturing the light emitting device according to the present disclosure.

Figure 21:
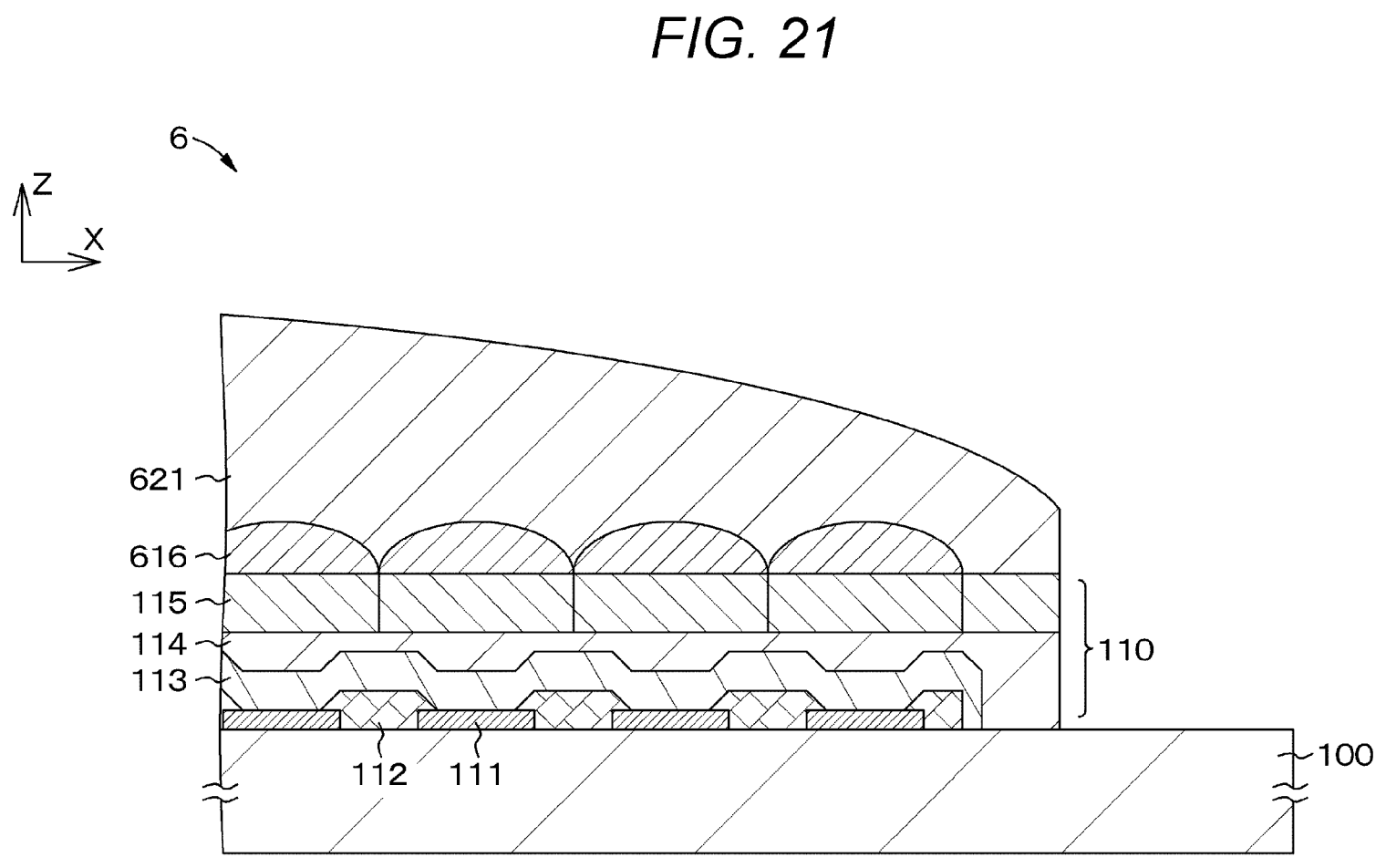

FIG. 21 is a schematic cross-sectional view of a part of the light emitting device for explaining the structure of the light emitting device according to the sixth embodiment. In the schematic perspective view of a light emitting device 6 according to the sixth embodiment, the light emitting device 1 is only required to be read as the light emitting device 6 in FIG. 1.

The light emitting device 6 according to the sixth embodiment has, for example, a configuration in which a microlens 616 is disposed on the color filter 115 and a single lens 621 is formed thereon in the light emitting device 1 of the first embodiment.

The method for manufacturing the light emitting device 6 is similar to [Step-100] to [Step-120] described in the first embodiment except that the microlens 616 is formed after the color filter 115 is formed, and thus description thereof is omitted.

Description of Electronic Device, and Others

The light emitting device of the present disclosure described above can be used as a display unit (light emitting device) of an electronic device in any field that displays a video signal input to the electronic device or a video signal generated in the electronic device as an image or a video. As an example, it can be used as a display unit of, for example, a television set, a digital still camera, a notebook personal computer, a mobile terminal device such as a mobile phone, a video camera, a head mounted display (head worn display), and the like.

The light emitting device of the present disclosure also includes a module having a sealed configuration. Note that a display module may be provided with a circuit unit for inputting and outputting a signal and the like from the outside to a light emitting region, a flexible printed circuit (FPC), and the like. Hereinafter, a digital still camera and a head mounted display will be exemplified as specific examples of the electronic device using the light emitting device of the present disclosure. However, the specific examples exemplified here are merely examples, and the present disclosure is not limited thereto.

Specific Example 1

Figure 22A:
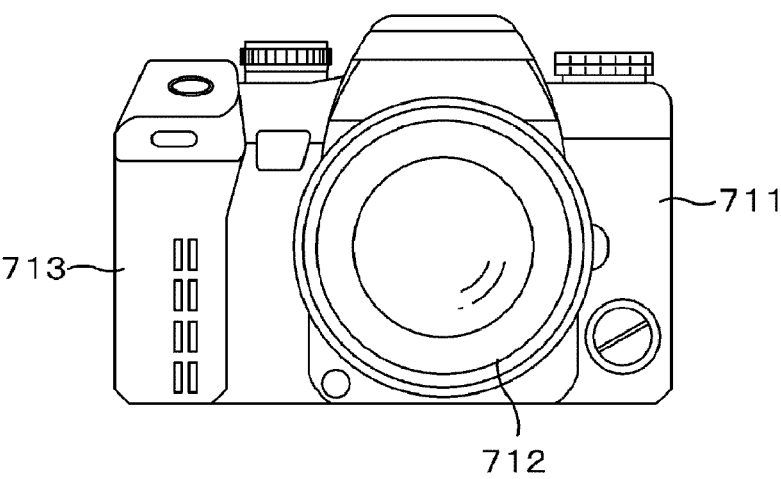
FIG. 22A illustrates a front view thereof and FIG. 22B illustrates a rear view thereof.
Figure 22B:
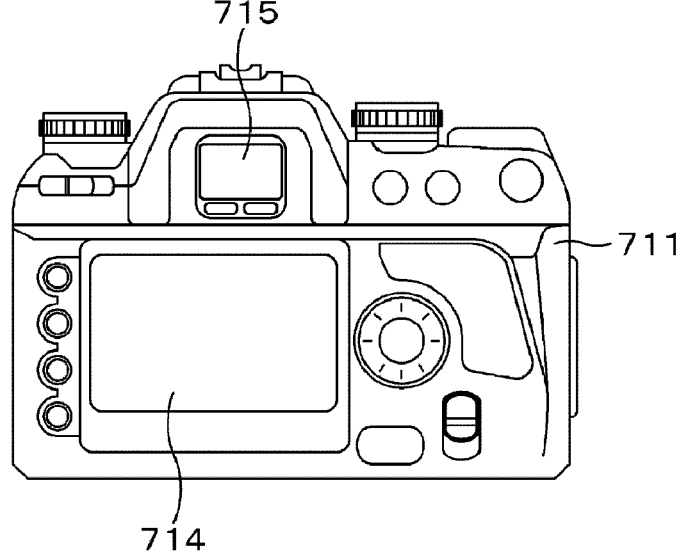

FIGS. 22A and 22B are external views of a lens interchangeable single lens reflex type digital still camera, and FIG. 22A illustrates a front view thereof and FIG. 22B illustrates a rear view thereof. The lens interchangeable single lens reflex type digital still camera includes, for example, an interchangeable imaging lens unit (interchangeable lens) 712 on a front right side of a camera main body (camera body) 711, and a grip portion 713 to be held by a photographer on a front left side thereof.

Then, a monitor 714 is provided substantially at the center of a back surface of the camera main body 711. A viewfinder (eyepiece window) 715 is provided above the monitor 714. By looking into the viewfinder 715, the photographer can visually recognize an optical image of a subject guided from the imaging lens unit 712 and determine a composition.

In the lens interchangeable single lens reflex type digital still camera having the configuration described above, the light emitting device of the present disclosure can be used as the viewfinder 715. That is, the lens interchangeable single lens reflex type digital still camera according to the present example is manufactured by using the light emitting device of the present disclosure as the viewfinder 715.

Specific Example 2

Figure 23:
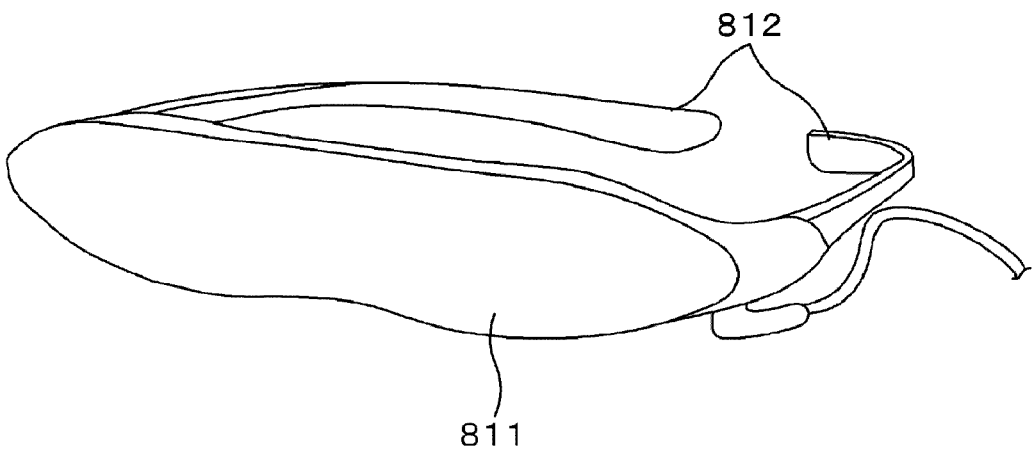
FIG. 23 is an external view of a head mounted display.

FIG. 23 is an external view of a head mounted display. The head mounted display includes, for example, ear hooking portions 812 to be worn on a head of a user on both sides of an eyeglass-shaped display unit 811. In this head mounted display, the light emitting device of the present disclosure can be used as the display unit 811. That is, the head mounted display according to the present example is manufactured by using the light emitting device of the present disclosure as the display unit 811.

Specific Example 3

Figure 24:
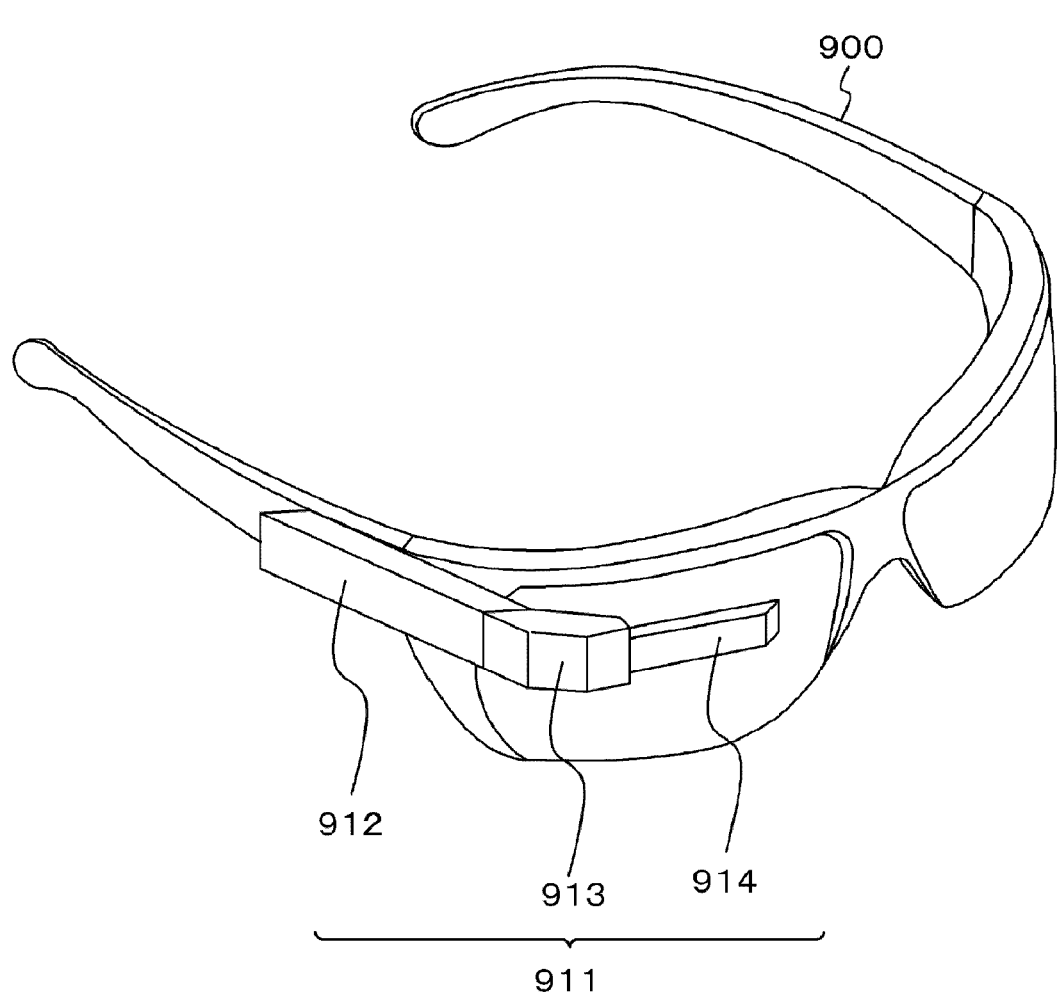
FIG. 24 is an external view of a see-through head mounted display.

FIG. 24 is an external view of a see-through head mounted display. A see-through head mounted display 911 includes a main body 912, an arm 913, and a lens barrel 914.

The main body 912 is connected with the arm 913 and glasses 900. Specifically, an end of the main body 912 in a long side direction is coupled to the arm 913, and one side of a side surface of the main body 912 is coupled to the glasses 900 via a connecting member. Note that the main body 912 may be directly mounted on a head of a human body.

The main body 912 incorporates a control board for controlling operation of the see-through head mounted display 911 and a display unit. The arm 913 connects the main body 912 and the lens barrel 914, and supports the lens barrel 914. Specifically, the arm 913 is coupled to the end of the main body 912 and an end of the lens barrel 914, and fixes the lens barrel 914. Furthermore, the arm 913 incorporates a signal line for communicating data related to an image provided from the main body 912 to the lens barrel 914.

The lens barrel 914 projects image light provided from the main body 912 via the arm 913 toward eyes of the user wearing the see-through head mounted display 911 through an eyepiece. In this see-through head mounted display 911, the light emitting device of the present disclosure can be used for the display unit of the main body 912.

Note that the effects described in the present specification are merely examples and are not limited, and there may be other effects.

Note that the technology according to the present disclosure can also have the following configurations.

[A1]

A light emitting device including:

a substrate;

a light emitting region including light emitting elements arranged in a matrix on the substrate; and a sealing portion located on the light emitting region, in which a single lens covering the light emitting region is formed in the sealing portion.

[A2]

The light emitting device according to [A1] described above, in which the single lens is made of an organic material or an inorganic material.

[A3]

The light emitting device according to [A2] described above, in which the single lens is made of silicon oxide or silicon nitride.

[A4]

The light emitting device according to any one of [A1] to [A3] described above, in which a color filter is formed between the light emitting region and the single lens.

[A5]

The light emitting device according to any one of [A1] to [A4] described above, in which the single lens is formed by etching processing or nanoimprint processing.

[A6]

The light emitting device according to any one of [A1] to [A5] described above, in which a counter substrate is disposed on the sealing portion.

[A7]

The light emitting device according to [A6] described above, in which a space between the single lens and the counter substrate is filled with an inorganic material or an organic material having a refractive index different from a refractive index of a material constituting the single lens.

[A8]

The light emitting device according to [A6] described above, in which a space between the single lens and the counter substrate is filled with a gas.

[A9]

The light emitting device according to any one of [A1] to [A8] described above, in which a microlens corresponding to each of the light emitting elements is formed between the light emitting region and the single lens.

[A10]

The light emitting device according to any one of [A1] to [A9] described above, in which another single lens is disposed on the single lens.

[A11]

The light emitting device according to any one of [A1] to [A10] described above, in which the light emitting element includes a light emitting unit including an organic electroluminescence element.

[A12]

The light emitting device according to any one of [A1] to [A11] described above, in which the single lens has a rotationally symmetric shape.

[A13]

The light emitting device according to any one of [A1] to [A11] described above, in which the single lens has a rotationally asymmetric shape.

[B1]

A method for manufacturing a light emitting device including:

a step of forming a light emitting region including light emitting elements arranged in a matrix on a substrate; and a step of performing sealing by forming a single lens covering the light emitting region.

[B2]

The method for manufacturing the light emitting device according to [B1] described above, in which the single lens made of an organic material or an inorganic material is formed.

[B3]

The method for manufacturing the light emitting device according to [B2] described above, in which the single lens made of silicon oxide or silicon nitride is formed.

[B4]

The method for manufacturing the light emitting device according to any one of [B1] to [B3] described above, further including:

a step of forming a color filter between the light emitting region and the single lens.

[B5]

The method for manufacturing the light emitting device according to any one of [B1] to [B4] described above, in which the single lens is formed by etching processing or nanoimprint processing.

[B6]

The method for manufacturing the light emitting device according to any one of [B1] to [B5] described above, further including:

a step of disposing a counter substrate on the single lens.

[B7]

The method for manufacturing the light emitting device according to [B6] described above, further including:

a step of filling a space between the single lens and the counter substrate with an inorganic material or an organic material having a refractive index different from a refractive index of a material constituting the single lens.

[B8]

The method for manufacturing the light emitting device according to [B6] described above, further including:

a step of filling a space between the single lens and the counter substrate with a gas.

[B9]

The method for manufacturing the light emitting device according to any one of [B1] to [B8] described above, further including:

a step of forming a microlens corresponding to each of the light emitting elements between the light emitting region and the single lens.

[B10]

The method for manufacturing the light emitting device according to any one of [B1] to [B9] described above, further including:

a step of disposing another single lens on the single lens.

[B11]

The method for manufacturing the light emitting device according to any one of [B1] to [B10] described above, in which the light emitting element including a light emitting unit including an organic electroluminescence element is formed.

[B12]

The method for manufacturing the light emitting device according to any one of [B1] to [B11] described above, in which the single lens having a rotationally symmetric shape is formed.

[B13]

The method for manufacturing the light emitting device according to any one of [B1] to [B11] described above, in which the single lens having a rotationally asymmetric shape is formed.

[C1]

An electronic device including a light emitting device including:

a substrate;

a light emitting region including light emitting elements arranged in a matrix on the substrate; and a sealing portion located on the light emitting region, in which a single lens covering the light emitting region is formed in the sealing portion.

[C2]

The electronic device according to [C1] described above, in which the single lens is made of an organic material or an inorganic material.

[C3]

The electronic device according to [C2] described above, in which the single lens is made of silicon oxide or silicon nitride.

[C4]

The electronic device according to any one of [C1] to [C3] described above, in which a color filter is formed between the light emitting region and the single lens.

[C5]

The electronic device according to any one of [C1] to [C4] described above, in which the single lens is formed by etching processing or nanoimprint processing.

[C6]

The electronic device according to any one of [C1] to [C5] described above, in which a counter substrate is disposed on the sealing portion.

[C7]

The electronic device according to [C6] described above, in which a space between the single lens and the counter substrate is filled with an inorganic material or an organic material having a refractive index different from a refractive index of a material constituting the single lens.

[C8]

The electronic device according to [C6] described above, in which a space between the single lens and the counter substrate is filled with a gas.

[C9]

The electronic device according to any one of [C1] to [C8] described above, in which a microlens corresponding to each of the light emitting elements is formed between the light emitting region and the single lens.

[C10]

The electronic device according to any one of [C1] to [C9] described above, in which another single lens is disposed on the single lens.

[C11]

The electronic device according to any one of [C1] to [C10] described above, in which the light emitting element includes a light emitting unit including an organic electroluminescence element.

[C12]

The electronic device according to any one of [C1] to [C11] described above, in which the single lens has a rotationally symmetric shape.

[C13]

The electronic device according to any one of [C1] to [C11] described above, in which the single lens has a rotationally asymmetric shape.

REFERENCE SIGNS LIST 1, 2, 3, 4, 5, 6 Light emitting device
100 Substrate
110 Portion where color filter, planarization film, and each layer constituting light emitting unit are stacked
111 First electrode
112 Partition wall
113 Portion where organic layer, second electrode, and protective layer are laminated 114 Planarization film
115 Color filter
120 Sealing portion
121, 121A, 121B, 121C, 121D, 121E1, 121E2 Single lens
121' Material layer constituting single lens
122 Filler
129 Resist for forming single lens
220 Sealing portion
222 Space in which gas is sealed
223 Seal portion
321 Single lens
420 Sealing portion
$421_1$, $421_2$ Single lens
422, $422_1$, $422_2$ Filler
510 Portion where planarization film and each layer constituting light emitting unit are stacked
616 Microlens
621 Single lens
711 Camera main body
712 Imaging lens unit
713 Grip portion
714 Monitor
715 Viewfinder
811 Eyeglass-shaped display unit
812 Ear hooking portion
900 Glasses
911 See-through head mounted display
912 Main body
913 Arm
914 Lens barrel
LP Light emitting region
ELP Light emitting element

The invention claimed is:

1. A light emitting device, comprising:
a substrate;
a light emitting region on the substrate, wherein the light emitting region includes a plurality of light emitting elements in a matrix;
a sealing portion on the light emitting region; and
a single lens that covers the light emitting region, wherein the single lens is in the sealing portion.

2. The light emitting device according to claim 1, wherein the single lens includes one of an organic material or an inorganic material.

3. The light emitting device according to claim 2, wherein the single lens includes one of silicon oxide or silicon nitride.

4. The light emitting device according to claim 1, further comprising a color filter between the light emitting region and the single lens.

5. The light emitting device according to claim 1, wherein the single lens is based on one of an etching process or a nanoimprint process.

6. The light emitting device according to claim 1, further comprising a counter substrate on the sealing portion.

7. The light emitting device according to claim 6, further comprising one of an inorganic material or an organic material in a space between the single lens and the counter substrate, wherein
the one of the inorganic material or the organic material has a refractive index different from a refractive index of a material of the single lens.

8. The light emitting device according to claim 6, wherein a space between the single lens and the counter substrate is filled with a gas.

9. The light emitting device according to claim 1, wherein a microlens corresponding to each of the plurality of light emitting elements is between the light emitting region and the single lens.

10. The light emitting device according to claim 1, wherein another single lens is on the single lens.

11. The light emitting device according to claim 1, wherein each light emitting element of the plurality of light emitting elements includes a light emitting unit including an organic electroluminescence element.

12. The light emitting device according to claim 1, wherein the single lens has a rotationally symmetric shape.

13. The light emitting device according to claim 1, wherein the single lens has a rotationally asymmetric shape.

14. The light emitting device according to claim 1, wherein the sealing portion includes a filler, and the filler is on each of:

a surface of the single lens, and a side surface of a portion including a stack of a color filter, a planarization film, and the light emitting region.

15. A method for manufacturing a light emitting device, the method comprising:

forming a light emitting region on a substrate, wherein the light emitting region includes a plurality of light emitting elements in a matrix;

forming a single lens covering the light emitting region; and forming a sealing portion on the light emitting region, wherein the single lens is in the sealing portion.

\* \* \* \* \*